US009558832B2

(12) United States Patent
Katou

(10) Patent No.: US 9,558,832 B2
(45) Date of Patent: Jan. 31, 2017

(54) SEMICONDUCTOR DEVICE INCLUDING BOOSTED VOLTAGE SUPPLY CIRCUIT FOR SUPPLYING BOOSTED VOLTAGE TO MEMORY ARRAY

(71) Applicant: Renesas Electronics Corporation, Tokyo (JP)

(72) Inventor: Kazuaki Katou, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/957,389

(22) Filed: Dec. 2, 2015

(65) Prior Publication Data

US 2016/0254057 A1    Sep. 1, 2016

(30) Foreign Application Priority Data

Feb. 26, 2015  (JP) ................. 2015-036743

(51) Int. Cl.
| | |
|---|---|
| *G11C 16/10* | (2006.01) |
| *G11C 5/14* | (2006.01) |
| *G11C 7/04* | (2006.01) |
| *G11C 16/04* | (2006.01) |
| *G11C 16/26* | (2006.01) |
| *G11C 16/30* | (2006.01) |

(52) U.S. Cl.
CPC .............. *G11C 16/10* (2013.01); *G11C 5/145* (2013.01); *G11C 7/04* (2013.01); *G11C 16/0425* (2013.01); *G11C 16/26* (2013.01); *G11C 16/30* (2013.01)

(58) Field of Classification Search
CPC ..... G11C 16/10; G11C 16/32; G11C 16/0483; G11C 16/06; G11C 16/12

USPC ......................................... 365/185.23, 185.17
See application file for complete search history.

(56) References Cited

U.S. PATENT DOCUMENTS

| | | | | |
|---|---|---|---|---|
| 6,735,119 | B2 * | 5/2004 | Mihara ................. | G11C 16/30 365/185.18 |
| 7,477,543 | B2 | 1/2009 | Choi | |
| 2004/0062085 | A1 * | 4/2004 | Wang ..................... | G11C 5/147 365/233.14 |
| 2012/0230132 | A1 * | 9/2012 | Soma ..................... | G11C 16/20 365/189.15 |

FOREIGN PATENT DOCUMENTS

JP          2007-193936 A       8/2007

* cited by examiner

*Primary Examiner* — Alexander Sofocleous
*Assistant Examiner* — Alfredo Bermudez Lozada
(74) *Attorney, Agent, or Firm* — McGinn IP Law Group, PLLC

(57) ABSTRACT

To maintain constant an output voltage of a boosted voltage circuit even when a program current of a nonvolatile memory increases; in a boosted voltage circuit provided in a semiconductor device, an output voltage of a charge pump is detected by a voltage dividing circuit, and on-off control is performed on an oscillation circuit for driving the charge pump so that the detected output voltage becomes constant. Further, an output current of the charge pump is detected, and a control current according to a magnitude of the detected output current is generated. The control current is fed into or drawn from a coupling node between a plurality of series-coupled resistance elements configuring the voltage dividing circuit.

19 Claims, 19 Drawing Sheets

|  | BL | WL | SL | WELL |  |
|---|---|---|---|---|---|
| READ | 1.5 V | 1.5 V | 0 V | 0 V |  |
| INCREASE Vth | 0 V | 10 V | 6 V | 0 V | (BIT-BY-BIT) |
| DECREASE Vth | 10 V | −10 V | 10 V | 10 V | (IN BLOCK) |

|  | BL | WL | SL | WELL |  |
|---|---|---|---|---|---|
| READ | 1.5 V | 1.5 V | 0 V | 0 V |  |
| INCREASE Vth | −10 V | 10 V | −10 V | −10 V | (IN BLOCK) |
| DECREASE Vth | 0 V | −10 V | 10 V | 0 V | (BIT-BY-BIT) |

FIG. 7

| WRITE DATA | WRITE CURRENT | Q401 CURRENT | Q402 CURRENT | Q405 CURRENT | Q406 CURRENT | Q407 CURRENT | Q408 CURRENT | Q403 CURRENT | Q404 CURRENT |
|---|---|---|---|---|---|---|---|---|---|
| 1111 | 0 μA | 10 μA | 200 nA | 200 nA | 100 nA | 1 μA − 100 nA = 900 nA | 900 nA | 900 nA | 900 nA |
| 0111 | 10 μA | 20 μA | 400 nA | 400 nA | 200 nA | 1 μA − 200 nA = 800 nA | 800 nA | 800 nA | 800 nA |
| 0011 | 20 μA | 30 μA | 600 nA | 600 nA | 300 nA | 1 μA − 300 nA = 700 nA | 700 nA | 700 nA | 700 nA |
| 0001 | 30 μA | 40 μA | 800 nA | 800 nA | 400 nA | 1 μA − 400 nA = 600 nA | 600 nA | 600 nA | 600 nA |
| 0000 | 40 μA | 50 μA | 1 μA | 1 μA | 500 nA | 1 μA − 500 nA = 500 nA | 500 nA | 500 nA | 500 nA |

FIG. 8

| WRITE DATA | WRITE CURRENT | R401 CURRENT | VOLTAGE ACROSS R401 | VOLTAGE OF OUTPUT NODE 602 OF BOOSTED VOLTAGE SUPPLY CIRCUIT 400 |
|---|---|---|---|---|
| 1111 | 0 μA | 10 μA − 900 nA = 9.1 μA | 9.1 μA * 989 KΩ ≒ 9.0 V | 9.0 V + 1 V = 10.0 V |
| 0111 | 10 μA | 10 μA − 800 nA = 9.2 μA | 9.2 μA * 989 KΩ ≒ 9.1 V | 9.1 V + 1 V = 10.1 V |
| 0011 | 20 μA | 10 μA − 700 nA = 9.3 μA | 9.3 μA * 989 KΩ ≒ 9.2 V | 9.2 V + 1 V = 10.2 V |
| 0001 | 30 μA | 10 μA − 600 nA = 9.4 μA | 9.4 μA * 989 KΩ ≒ 9.3 V | 9.3 V + 1 V = 10.3 V |
| 0000 | 40 μA | 10 μA − 500 nA = 9.5 μA | 9.5 μA * 989 KΩ ≒ 9.4 V | 9.4 V + 1 V = 10.4 V |

FIG. 12

| WRITE DATA | WRITE CURRENT | Q401 CURRENT | Q402 CURRENT | Q405 CURRENT | Q406 CURRENT |
|---|---|---|---|---|---|
| 1111 | 0 μA | 10 μA | 200 nA | 200 nA | 115 nA |
| 0111 | 10 μA | 20 μA | 400 nA | 400 nA | 230 nA |
| 0011 | 20 μA | 30 μA | 600 nA | 600 nA | 345 nA |
| 0001 | 30 μA | 40 μA | 800 nA | 800 nA | 460 nA |
| 0000 | 40 μA | 50 μA | 1 μA | 1 μA | 575 nA |

FIG. 13

| WRITE DATA | WRITE CURRENT | R401 CURRENT | VOLTAGE ACROSS R401 | VOLTAGE OF OUTPUT NODE 602 OF BOOSTED VOLTAGE SUPPLY CIRCUIT 400A |
|---|---|---|---|---|
| 1111 | 0 μA | 10 μA + 115 nA = 10.115 μA | 10.115 μA * 890 KΩ ≒ 9.0 V | 9.0 V + 1 V = 10.0 V |
| 0111 | 10 μA | 10 μA + 230 nA = 10.230 μA | 10.230 μA * 890 KΩ ≒ 9.1 V | 9.1 V + 1 V = 10.1 V |
| 0011 | 20 μA | 10 μA + 345 nA = 10.345 μA | 10.345 μA * 890 KΩ ≒ 9.2 V | 9.2 V + 1 V = 10.2 V |
| 0001 | 30 μA | 10 μA + 460 nA = 10.460 μA | 10.460 μA * 890 KΩ ≒ 9.3 V | 9.3 V + 1 V = 10.3 V |
| 0000 | 40 μA | 10 μA + 575 nA = 10.575 μA | 10.575 μA * 890 KΩ ≒ 9.4 V | 9.4 V + 1 V = 10.4 V |

FIG. 15

| TEMPERATURE | WRITE DATA | WRITE CURRENT | Q401 CURRENT | Q402 CURRENT | Q405 CURRENT | Q406 CURRENT | Q501 CURRENT | Q502 CURRENT | Q407 CURRENT | Q408 CURRENT | Q403 CURRENT | Q404 CURRENT |
|---|---|---|---|---|---|---|---|---|---|---|---|---|
| −40 | 0000 | 40μA | 50μA | 1μA | 1μA | 500nA | 4.2μA | 840nA | 2μA − 500nA − 840nA = 660nA | 660nA | 660nA | 600nA |
| 25 | 0000 | 40μA | 50μA | 1μA | 1μA | 500nA | 5μA | 1μA | 2μA − 500nA − 1μA = 500nA | 500nA | 500nA | 500nA |
| 125 | 0000 | 40μA | 50μA | 1μA | 1μA | 500nA | 6.2μA | 1.24μA | 2μA − 500nA − 1.24μA = 260nA | 260nA | 260nA | 260nA |

FIG. 16

| TEMPERATURE | WRITE DATA | WRITE CURRENT | R401 CURRENT | VOLTAGE ACROSS R401 | VOLTAGE OF OUTPUT NODE 602 OF BOOSTED VOLTAGE SUPPLY CIRCUIT 500 |
|---|---|---|---|---|---|
| −40 | 0000 | 40 μA | 10 μA − 660 nA = 9.34 μA | 9.34 μA * 989 KΩ ≒ 9.2 V | 9.2 V + 1 V = 10.2 V |
| 25 | 0000 | 40 μA | 10 μA − 500 nA = 9.5 μA | 9.5 μA * 989 KΩ ≒ 9.4 V | 9.4 V + 1 V = 10.4 V |
| 125 | 0000 | 40 μA | 10 μA − 260 nA = 9.74 μA | 9.74 μA * 989 KΩ ≒ 9.6 V | 9.6 V + 1 V = 10.6 V |

FIG. 20

| TEMPERATURE | WRITE DATA | WRITE CURRENT | Q401 CURRENT | Q402 CURRENT | Q405 CURRENT | Q406 CURRENT | Q501 CURRENT | Q502 CURRENT |
|---|---|---|---|---|---|---|---|---|
| −40 | 0000 | 40 μA | 50 μA | 1 μA | 1 μA | 575 nA | 4.2 μA | 1.05 μA |
| 25 | 0000 | 40 μA | 50 μA | 1 μA | 1 μA | 575 nA | 5 μA | 1.25 μA |
| 125 | 0000 | 40 μA | 50 μA | 1 μA | 1 μA | 575 nA | 6.2 μA | 1.55 μA |

FIG. 21

| TEMPERATURE | WRITE DATA | WRITE CURRENT | R401 CURRENT | VOLTAGE ACROSS R401 | VOLTAGE OF OUTPUT NODE 602 OF BOOSTED VOLTAGE SUPPLY CIRCUIT 500A |
|---|---|---|---|---|---|
| −40 | 0000 | 40 μA | 10 μA + 575 nA + 1.05 μA = 11.625 μA | 11.625 μA * 793 KΩ ≈ 9.2 V | 9.2 V + 1 V = 10.2 V |
| 25 | 0000 | 40 μA | 10 μA + 575 nA + 1.25 μA = 11.825 μA | 11.825 μA * 793 KΩ ≈ 9.4 V | 9.4 V + 1 V = 10.4 V |
| 125 | 0000 | 40 μA | 10 μA + 575 nA + 1.55 μA = 12.125 μA | 12.125 μA * 793 KΩ ≈ 9.6 V | 9.6 V + 1 V = 10.6 V |

SEMICONDUCTOR DEVICE INCLUDING BOOSTED VOLTAGE SUPPLY CIRCUIT FOR SUPPLYING BOOSTED VOLTAGE TO MEMORY ARRAY

CROSS-REFERENCE TO RELATED APPLICATIONS

The disclosure of Japanese Patent Application No. 2015-036743 filed on Feb. 26, 2015 including the specification, drawings and abstract is incorporated herein by reference in its entirety.

BACKGROUND

The present invention relates to a semiconductor device, and particularly to a semiconductor device including an electrically rewritable nonvolatile memory.

In a nonvolatile memory such as a flash memory, a write current flows through a memory cell subjected to writing during programming. In this case, an increase in the number of simultaneously programmed memory cells makes it difficult to maintain constant the voltage level of a program voltage.

To address this problem, a flash memory device described in Japanese Unexamined Patent Publication No. 2007-193936 (Patent Document 1) includes, besides a flash memory cell array, a plurality of dummy program current generating elements each capable of passing a dummy program current having the same magnitude as a program current. Further, control is performed so that the sum of a plurality of program currents and a plurality of dummy program currents becomes constant regardless of the number of simultaneously programmed memory cells.

SUMMARY

According to the technique of Patent Document 1, as the number of simultaneously programmed memory cells decreases, the sum of dummy program currents increases. This disadvantageously increases the current consumption. The other problems and novel features will become apparent from the description of this specification and the accompanying drawings.

In a boosted voltage supply circuit provided in a semiconductor device according to one embodiment, an output voltage of a charge pump is detected by a voltage dividing circuit, and on-off control is performed on an oscillation circuit for driving the charge pump so that the detected output voltage becomes constant. Further, an output current of the charge pump is detected, and a control current according to a magnitude of the detected output current is generated. The control current is fed into or drawn from a coupling node between a plurality of series-coupled resistance elements configuring the voltage dividing circuit.

According to the above embodiment, it is possible to maintain constant the output voltage of the boosted voltage circuit even when the program current increases.

BRIEF DESCRIPTION OF THE DRAWINGS

FIG. 7 is a table associating the values of currents flowing through transistors in the boosted voltage supply circuit in FIG. 6 with write data.

FIG. 8 is a table associating the values of voltages across a resistance element R401 of a voltage dividing circuit in FIG. 6 and write voltages with write data.

FIG. 12 is a table associating the values of currents flowing through transistors in the boosted voltage supply circuit in FIG. 11 with write data.

FIG. 13 is a table associating the values of voltages across the resistance element R401 of the voltage dividing circuit in FIG. 11 and write voltages with write data.

FIG. 15 is a table associating the values of currents flowing through transistors in the boosted voltage supply circuit in FIG. 14 with temperatures.

FIG. 16 is a table associating the values of voltages across the resistance element R401 of the voltage dividing circuit in FIG. 14 and write voltages with temperatures.

FIG. 20 is a table associating the values of currents flowing through transistors in the boosted voltage supply circuit in FIG. 19 with temperatures.

FIG. 21 is a table associating the values of voltages across the resistance element R401 of the voltage dividing circuit in FIG. 19 and write voltages with temperatures.

DETAILED DESCRIPTION

Figure 1:
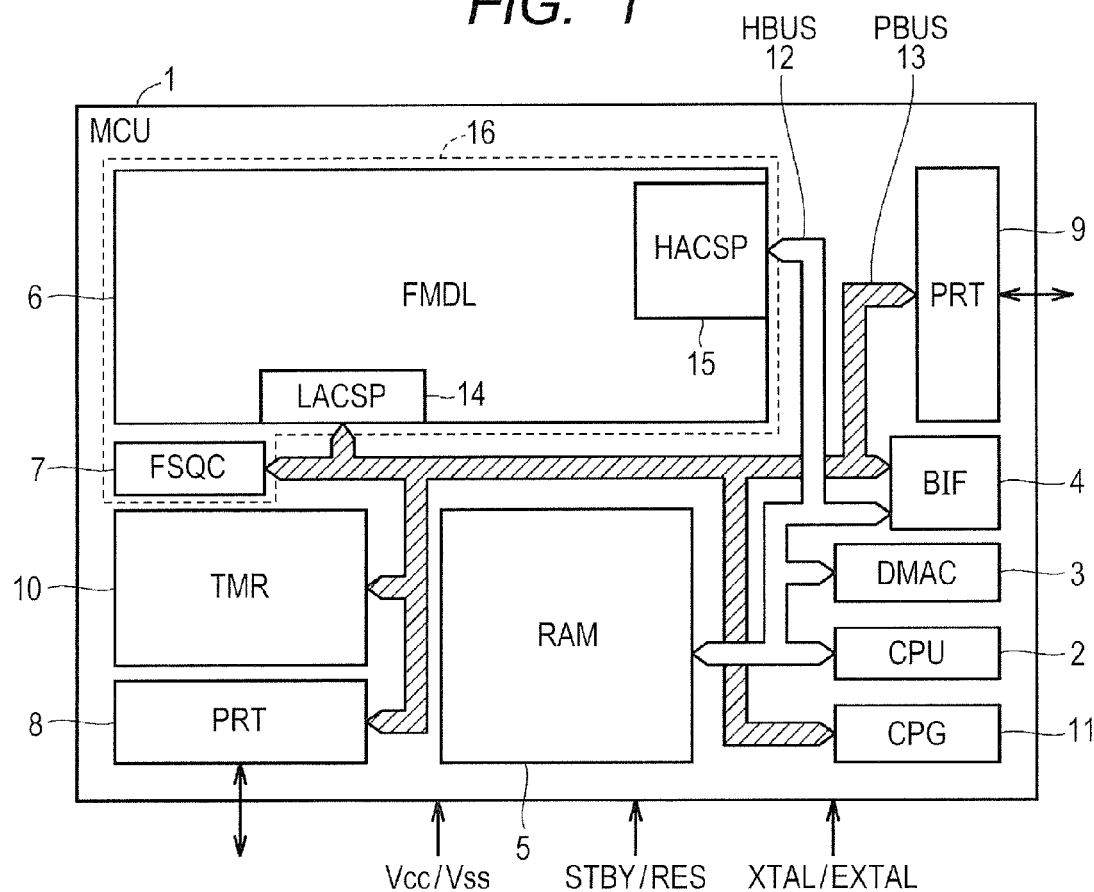
FIG. 1 is a block diagram showing the configuration of a semiconductor device according to a first embodiment.

Hereinafter, various embodiments will be described in detail with reference to the drawings. The same or equivalent sections are denoted by the same reference numerals, and their description will not be repeated.

First Embodiment

[Overall Configuration of Semiconductor Device]

FIG. 1 is a block diagram showing the configuration of a semiconductor device according to the first embodiment. FIG. 1 shows the configuration of a microcomputer (MCU) 1 incorporating a flash memory module 16, as an example of the semiconductor device. A boosted voltage supply circuit 400 described in this embodiment is also applicable to a semiconductor device in which only the flash memory module 16 is mounted over a single silicon substrate.

Referring to FIG. 1, the microcomputer 1 is formed over a single semiconductor chip made of e.g. monocrystalline silicon, using a CMOS (Complementary Metal Oxide Semiconductor) integrated circuit manufacturing technology or the like.

As shown in FIG. 1, the microcomputer 1 includes a central processing unit (CPU) 2, a random access memory (RAM) 5, and a flash memory module (FMDL) 6. The central processing unit 2 includes an instruction control unit and an execution unit to execute instructions. The random access memory 5 is used as e.g. a work area of the central processing unit 2. The flash memory module 6 is provided as a nonvolatile memory module for storing data and programs.

The microcomputer 1 further includes a direct memory access controller (DMAC) 3, a bus interface circuit (BIF) 4, a flash sequencer (FSQC) 7, external I/O ports (PRT) 8 and 9, a timer (TMR) 10, a clock pulse generator (CPG) 11, a high-speed bus (HBUS) 12, and a peripheral bus (PBUS) 13.

The bus interface circuit 4 performs bus interface control or bus bridge control of the high-speed bus 12 and the peripheral bus 13. The flash sequencer 7 performs command access control on the flash memory module (FMDL) 6. The clock pulse generator 11 generates an internal clock CLK for controlling the microcomputer 1.

Although the bus structure of the microcomputer 1 is not particularly limited; in FIG. 1, the high-speed bus (HBUS) 12 and the peripheral bus (PBUS) 13 are provided. Although not restricted, the high-speed bus 12 and the peripheral bus 13 each include a data bus, an address bus, and a control bus. By providing the two buses of the high-speed bus 12 and the peripheral bus 13; as compared to the common coupling of all circuits to a common bus, it is possible to lighten the load on the bus and thereby ensure a high-speed access operation.

The central processing unit 2, the direct memory access controller 3, the bus interface circuit 4, the random access memory 5, and the flash memory module 6 are coupled to the high-speed bus 12. The flash sequencer 7, the external I/O ports 8 and 9, the timer 10, and the clock pulse generator 11 are coupled to the peripheral bus 13.

The microcomputer 1 further includes a clock terminal XTAL/EXTAL to which an oscillator is coupled or an external clock is supplied, an external hardware standby terminal STBY for specifying a standby state, an external reset terminal RES for specifying reset, an external power source terminal VCC, and an external ground terminal VSS.

While the flash sequencer 7 as a logic circuit and the flash memory module 6 having an array structure are designed using different CAD tools and therefore shown as separate circuit blocks in FIG. 1 for the sake of convenience, it can be considered that they configure one flash memory module 16.

The flash memory module 6 is coupled to the high-speed bus (HBUS) 12 through a read-only high-speed access port (HACSP) 15. The CPU 2 or the DMAC 3 can make read access to the flash memory module 6 through the high-speed access port 15 over the high-speed bus 12. The CPU 2 or the DMAC 3 issues a command to the flash sequencer 7 through the bus interface circuit 4 and the peripheral bus (PBUS) 13 when making write access and initialization (erase) access to the flash memory module 6. In response to the command, the flash sequencer 7 performs initialization control and write control on the flash memory module through the low-speed access port (LACSP) over the peripheral bus PBUS.

[Configuration and Operation of Memory Cell]

Figures 2A, 2B:
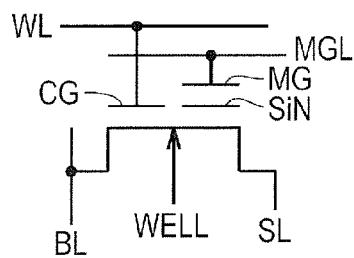
FIGS. 2A-2B are diagrams for explaining the configuration and operation of a memory cell (split gate flash memory device).
Figures 3A, 3B, 3C:
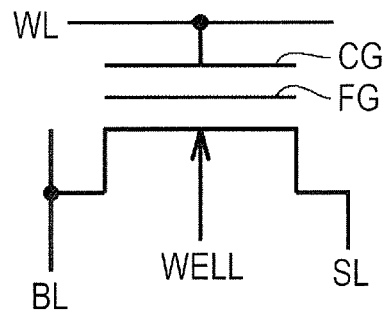
FIGS. 3A-3C are diagrams for explaining the configuration and operation of a memory cell (stacked gate flash memory cell).

FIGS. 2A-2B and 3A-3C are diagrams for explaining the configuration and operation of a memory cell. FIGS. 2A-2B show a split gate flash memory device, and FIG. 3A shows a stacked gate flash memory cell.

Referring to FIG. 2A, the split gate flash memory device includes a control gate CG and a memory gate MG disposed through a gate insulating film over a channel forming region between a source region and a drain region. A charge trap region (SiN) of e.g. silicon nitride is disposed between the memory gate MG and the gate insulating film. The control gate CG is coupled to a word line WL, and the memory gate MG is coupled to a memory gate selection line MGL. The drain region (or the source region) on the control gate CG side is coupled to a bit line BL, and the source region (or the drain region) on the memory gate MG side is coupled to a source line SL.

FIG. 2B shows an example of the voltage settings of the bit line BL, the control gate CG, the memory gate MG, the source line SL, and a well region (WELL) during the reading and writing (programming)/erasing of the split gate flash memory device.

More specifically, to decrease the threshold voltage Vth of the memory cell subjected to data erasing, settings such as BL=Hi-Z (high impedance), CG=0.0V, MG=−10V, SL=6V, and WELL=0V are performed. Thereby, holes of the electrons and holes generated by a high electric field between the well region (WELL) and the memory gate MG are injected from the well region (WELL) into the charge trap region (SiN). This process is executed in units of a plurality of memory cells sharing the memory gate.

To increase the threshold voltage Vth of the memory cell subjected to data writing, settings such as BL=0V, CG=1.5V, MG=10V, SL=6V, and WELL=0V are performed. In this case, a write current flows from the source line SL to the bit line, so that hot electrons are generated at the boundary between the control gate and the memory gate and injected into the charge trap region (SiN). As the injection of electrons is determined based on whether or not to pass a bit line current, this process is controlled in units of bits.

At the time of reading, settings such as BL=1.5V, CG=1.5V, MG=0V, SL=0V, and WELL=0V are performed. If the threshold voltage Vth of the memory cell is low, the resistance of the memory cell is small (ON state). If the threshold voltage Vth is high, the resistance of the memory cell is large (OFF state).

The stacked gate flash memory device shown in FIG. 3A is structured by stacking a floating gate FG and a control gate CG through a gate insulating film over a channel forming region between a source region and a drain region. The control gate CG is coupled to a word line WL. The drain region is coupled to a bit line BL, and the source region is coupled to a source line SL.

FIGS. 3B and 3C show examples of the voltage settings of the bit line BL, the word line WL, the source line SL, and a well region (WELL) during the reading and writing/erasing of the stacked gate flash memory device. FIG. 3B shows a voltage setting example of increasing the threshold voltage Vth by the hot carrier write method and decreasing the threshold voltage Vth by the emission of electrons into the well region WELL. FIG. 3C shows a voltage setting example of increasing the threshold voltage Vth by the FN tunnel write method and decreasing the threshold voltage Vth by the emission of electrons into the source line SL.

[Configuration and Operation of Flash Memory Module]

Figure 4:
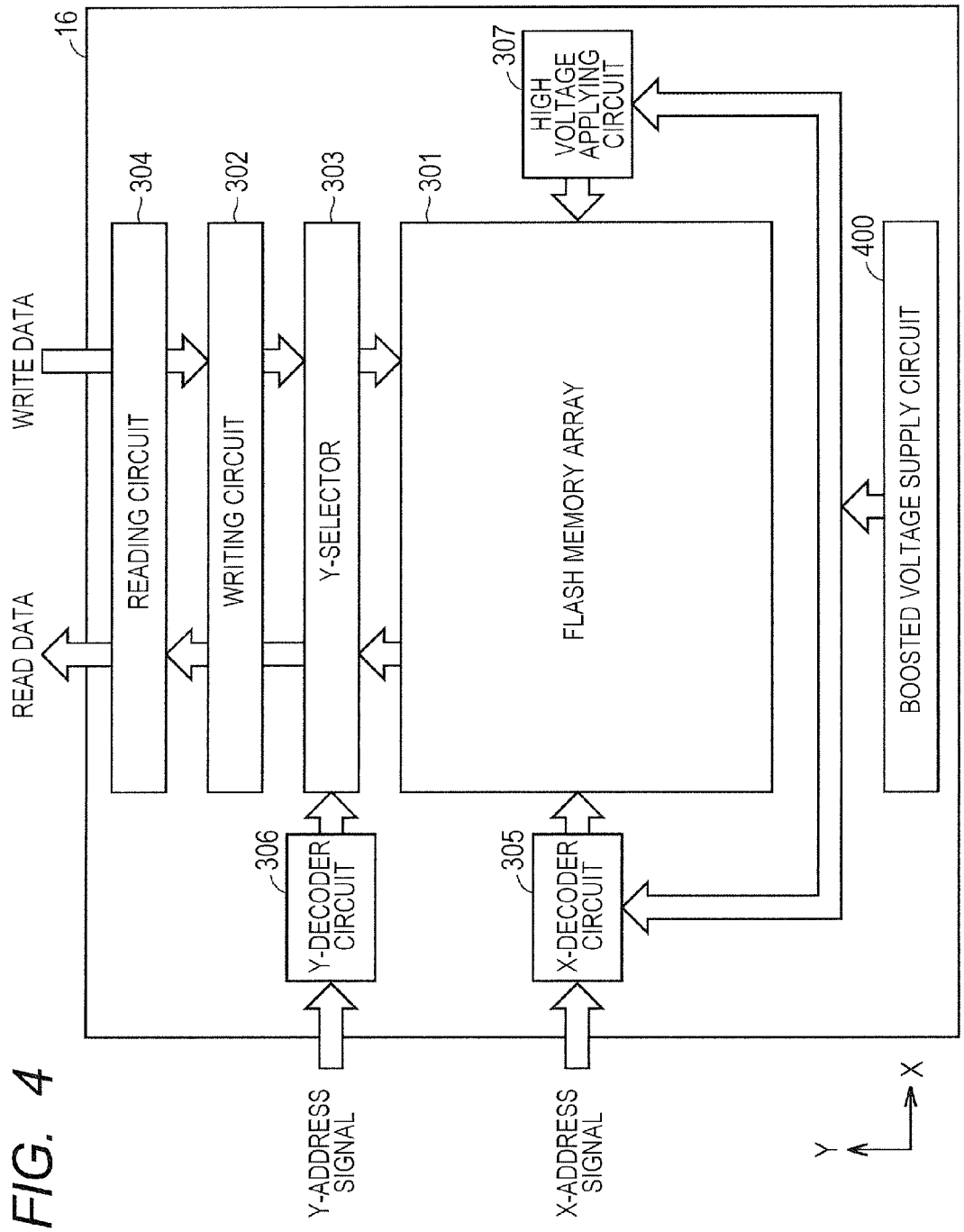
FIG. 4 is a block diagram showing the configuration of a flash memory module 16 shown in FIG. 1.
Figure 5:
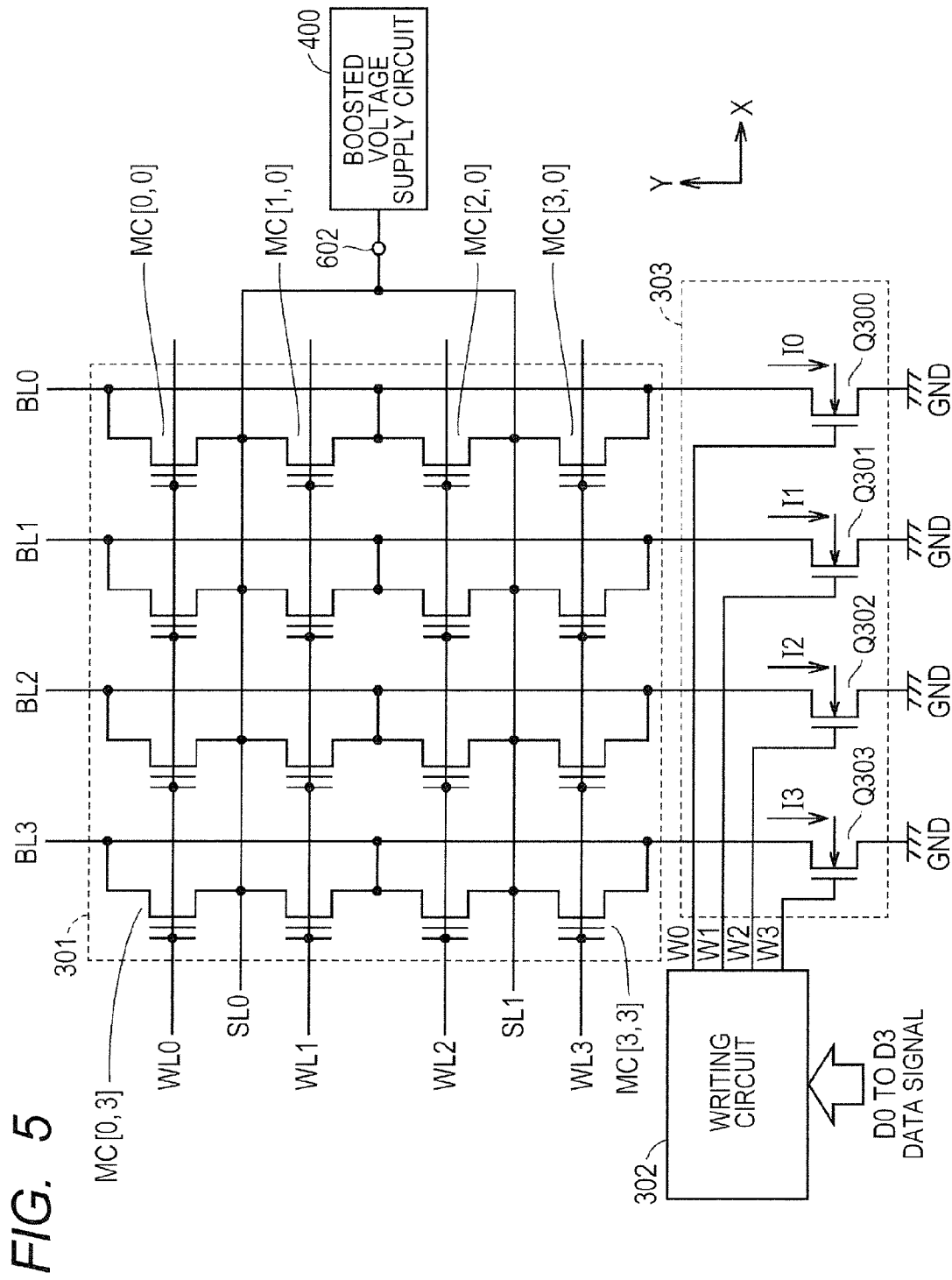
FIG. 5 is a diagram showing a partial configuration of the flash memory module shown in FIG. 4.

FIG. 4 is a block diagram showing the configuration of the flash memory module 16 shown in FIG. 1. In FIG. 4 and FIG. 5, the horizontal direction of the diagram is referred to as a row direction or X direction, and the vertical direction of the diagram is referred to as a column direction or Y direction.

Referring to FIG. 4, the flash memory module 16 includes a flash memory array 301, a Y-decoder circuit 306, a Y-selector circuit 303, a reading circuit 304, a writing circuit 302, an X-decoder circuit 305, a high voltage applying circuit 307, and a boosted voltage supply circuit 400.

The flash memory array 301 includes a plurality of flash memory cells arranged in a matrix. The flash memory cells can be of the split gate type shown in FIGS. 2A-2B or the stacked gate type shown in FIGS. 3A-3C.

The Y-decoder circuit 306 decodes a Y-address signal. The Y-selector circuit 303 selects a column subjected to reading or writing in the flash memory array 301, based on the result of decoding the Y-address signal. More specifically, the Y-selector circuit 303 couples the bit line of a column subjected to reading to the reading circuit 304 during data reading, and couples the bit line of a column subjected to writing to the writing circuit 302 during data writing.

The reading circuit 304 outputs read data by comparing a signal read from the memory cell column selected by the Y-selector circuit 303 with a reference signal. The writing circuit 302 passes a write current (also referred to as a program current) according to write data through the bit line of the column selected by the Y-selector circuit 303.

The X-decoder circuit 305 decodes an X-address signal and thereby selects a row subjected to reading, writing, or erasing in the flash memory array 301. More specifically, the X-decoder circuit 305 applies a voltage according to each operation mode of reading, writing, and erasing to the word line (the word line and the memory gate selection line in the case of the split gate memory cell) of the selected row.

The high voltage applying circuit 307 applies a high voltage to the source line during data writing and data erasing (also to the well region during data erasing in the case of the stacked gate memory cell). In this case, the high voltage is applied in units of blocks.

The boosted voltage supply circuit 400 generates a positive or negative high voltage used during writing and erasing, and supplies it to the X-decoder circuit 305 and the high voltage applying circuit 307.

FIG. 5 is a diagram showing a partial configuration of the flash memory module shown in FIG. 4. FIG. 5 shows a simplified configuration of the flash memory array 301 and the Y-selector circuit 303 shown in FIG. 4. To facilitate the understanding of the diagram, 16 memory cells MC[0, 0] to MC[3, 3] are representatively shown in the flash memory array 301. The memory cell of the ith row (i=0 to 3) and the jth column (j=0 to 3) is referred to as MC[i, j]. The generic name of a plurality of memory cells or an unspecified memory cell is referred to as a memory cell MC. In FIG. 5, the stacked gate memory device is used as each memory cell.

Referring to FIG. 5, the bit lines BL0 to BL3 are arranged extending in the Y direction and respectively corresponding to the columns of the flash memory array 301. Each bit line BL is coupled to the drain region of each memory cell MC of the corresponding column.

The word lines WL0 to WL3 are arranged extending in the X direction and respectively corresponding to the rows of the flash memory array 301. Each word line WL is coupled to the control gate of each memory cell MC of the corresponding row.

The source lines SL0, SL1 are provided extending in the row direction (X direction) of the flash memory array 301. In FIG. 5, one source line SL is arranged every two rows of the flash memory array 301 and coupled to the source region of each memory cell MC provided in the corresponding row. Further, the source lines SL0, SL1 are coupled to an output node 602 of the boosted voltage supply circuit 400 through the high voltage applying circuit 307 (not shown).

The Y-selector circuit 303 includes NMOS (N-channel MOS) transistors Q300 to Q303 corresponding to the bit lines BL0 to BL3 respectively. Each NMOS transistor is coupled between an end of the corresponding bit line and a ground node GND, and used as a switch for switching between coupling and decoupling. The writing circuit 302 supplies control signals W0 to W3 to the gates of the transistors Q300 to Q303 based on write data signals D0 to D3, respectively. Hereinafter, if the write data signal is "0", the control signal of a high level (H level) is supplied to the gate of the corresponding transistor. If the write data signal is "1", the control signal of a low level (L level) is supplied to the gate of the corresponding selection transistor.

Hereinafter, referring to FIG. 5, an example of a write operation will be described. Assume that the word line WL0 is selected and the high voltage (e.g., 10V) is applied to the selected word line WL0. The other word lines WL1 to WL3 are in an unselected state (at the L level).

For example, if all the write data signals D0 to D3 are "0", all the control signals W0 to W3 outputted from the writing circuit 302 are "H", and all the NMOS transistors Q300 to Q303 are turned on. Consequently, write currents I0 to I3 flow through the selected memory cells MC[0, 0] to MC[0, 3] respectively, so that writing is performed.

If all the write data signals D0 to D3 are "1", all the control signals W0 to W3 outputted from the writing circuit 302 are "L", and all the NMOS transistors Q300 to Q303 are turned off. Consequently, the write currents do not flow through the selected memory cells MC[0, 0] to MC[0, 3], so that writing is not performed.

If the write data signals D0 to D3 are "0, 1, 0, 1", the control signals W0 and W2 outputted from the writing circuit 302 are "H", and the control signals W1 and W3 are "L". Thereby, the NMOS transistors Q300 and Q302 are turned on, and the NMOS transistors Q301 and Q303 are turned off. Consequently, the write currents flow through the memory cells MC[0, 0] and MC[0, 2], so that writing is performed on these memory cells. On the other hand, the write currents do not flow through the memory cells MC[0, 1] and MC[0, 3], so that writing is not performed on these memory cells.

Thus, it is determined whether or not the write current flows through the selected memory cell in accordance with the write data (that is, depending on whether the write data is "1" or "0"). The write current flowing through one selected memory cell during writing is about 10 μA. Therefore, if all the memory cells MC[0, 0] to MC[0, 3] of the selected row in FIG. 5 are in the write state, the sum of the write currents flowing through the memory cells from the output node 602 of the boosted Voltage supply circuit 400 is 10 μA×4=40 μA.

The boosted voltage supply circuit 400 is configured to be able to supply the write currents (40 μA in FIG. 5) to all the selected memory cells in a state of maintaining the output voltage at a predetermined write voltage (e.g., 10V). The characteristics of the flash memory cell are affected by the write voltage (program voltage). If the write voltage is too high, a write time becomes short, but damage to the memory cell increases. On the other hand, if the write voltage is too low, the damage to the memory cell decreases, but the write time becomes long. Therefore, it is necessary to maintain the write voltage at a constant value.

[Configuration of Boosted Voltage Supply Circuit]

Figure 6:
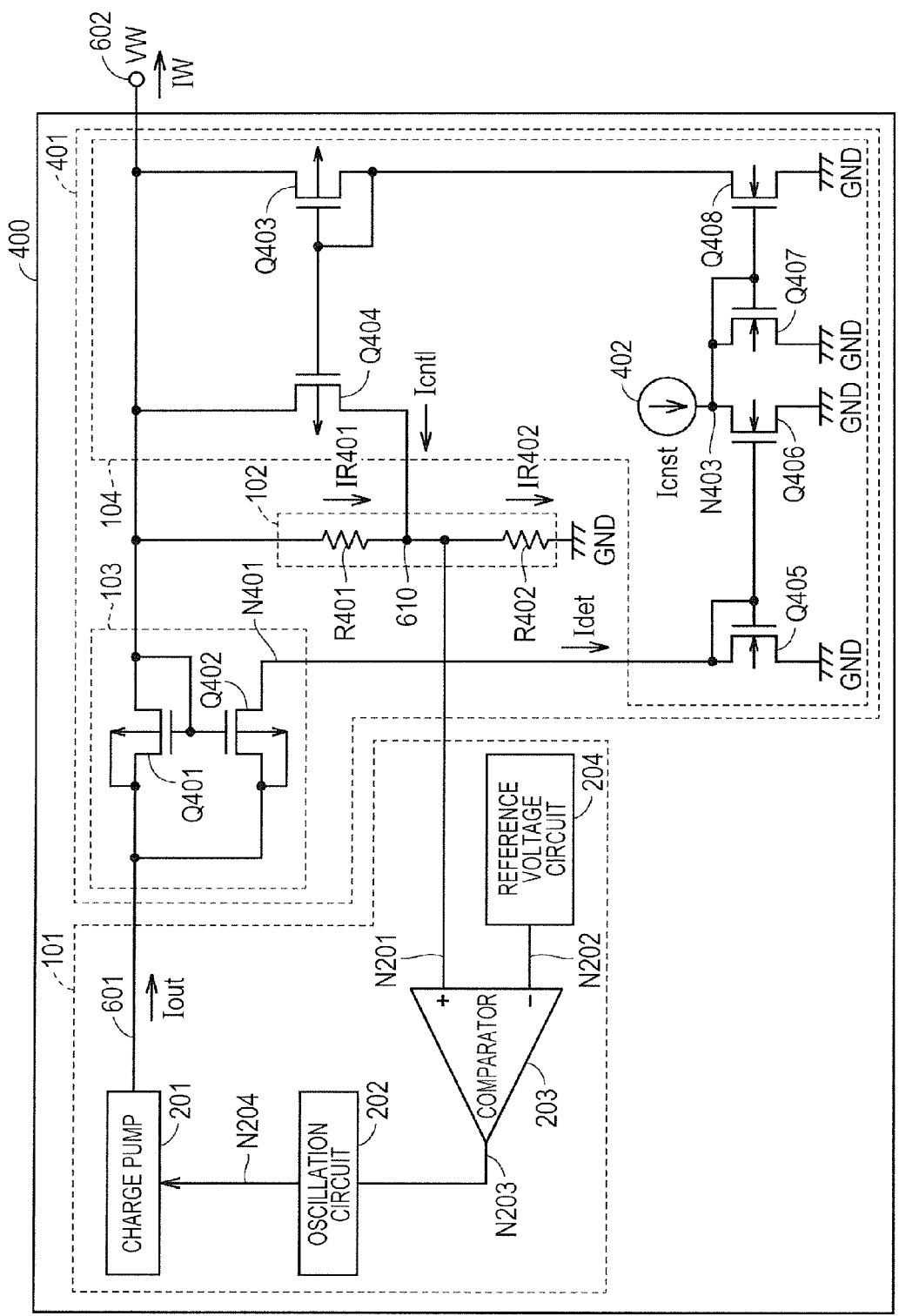
FIG. 6 is a circuit diagram showing the configuration of a boosted voltage supply circuit 400 in FIGS. 4 and 5.

FIG. 6 is a circuit diagram showing the configuration of the boosted voltage supply circuit 400 in FIGS. 4 and 5. Referring to FIG. 6, the boosted voltage supply circuit 400 includes a boosted voltage generation unit 101 and a boosted voltage adjustment unit 401.

(1. Boosted Voltage Generation Unit)

The boosted voltage generation unit 101 includes a charge pump 201 for generating a boosted voltage, an oscillation circuit 202, a comparator 203, and a reference voltage circuit 204. The oscillation circuit 202 generates a clock signal N204 for driving the charge pump 201. The reference voltage circuit 204 outputs a reference voltage N202 of a constant voltage level little affected by a power supply voltage, a temperature, and a manufacturing state. The comparator 203 receives a divided voltage N201 of the output voltage of the charge pump 201 from the boosted voltage adjustment unit 401. The comparator 203 compares the divided voltage N201 with the reference voltage N202.

The oscillation operation of the oscillation circuit 202 is turned on or off in accordance with a comparison result N203 of the comparator 203. More specifically, when the divided voltage N201 exceeds the reference voltage N202, the oscillation circuit 202 stops the oscillation operation. When the divided voltage N201 falls below the reference voltage N202, the oscillation circuit 202 resumes the oscillation operation. Since the charge pump 200 boosts the voltage during the operation of the oscillation circuit 202, the intermittent operation (on-off operation) of the oscillation circuit 202 enables the boosted voltage outputted from the charge pump 201 to be maintained at an approximately constant value.

(2. Boosted Voltage Adjustment Unit—Voltage Dividing Circuit)

The boosted voltage adjustment unit 401 includes a voltage dividing circuit 102, a current detection circuit 103, and a control current generation circuit 104. The voltage dividing circuit 102 includes a plurality of resistance elements coupled in series between the output node 602 of the boosted voltage supply circuit 400 and the ground node GND. In FIG. 6, the voltage dividing circuit 102 includes a first resistance element R401 coupled between the output node 602 and a voltage dividing node 610 and a second resistance element R402 coupled between the voltage dividing node 610 and the ground node GND. The voltage dividing node 610 is coupled to the positive terminal of the comparator 203, and thus provides the divided voltage N201 to the comparator 203.

The configuration of the resistance element is not particularly limited. Polysilicon may be used as the resistance element, or a diffusion region or a well region may be used as the resistance element. Alternatively, a MOS transistor may be used as the resistance element.

(3. Boosted Voltage Adjustment Unit—Current Detection Circuit)

The current detection circuit 103 detects an output current Iout of the charge pump 201. More specifically, the current detection circuit 103 includes PMOS (P-channel MOS) transistors Q401 and Q402.

First, the relation of coupling of the current detection circuit 103 will be described. The source of the PMOS transistor Q401 is coupled to an output node 601 of the charge pump 201. The drain of the PMOS transistor Q401 is coupled to the output node 602 of the boosted voltage supply circuit 400, and also coupled to the gate of the PMOS transistor Q401 (that is, the PMOS transistor Q401 is diode-coupled). The back gate (WELL) of the PMOS transistor Q401 is coupled to the source of the PMOS transistor Q401. The source of the PMOS transistor Q402 is coupled to the source of the PMOS transistor Q401. The gate of the PMOS transistor Q402 is coupled to the gate of the PMOS transistor Q401. The back gate (WELL) of the PMOS transistor Q402 is coupled to the source of the PMOS transistor Q402.

According to the above configuration, the PMOS transistors Q401, Q402 configure a current mirror; therefore, a detection current Idet proportional to the output current Iout of the charge pump 201 is outputted from the drain of the PMOS transistor Q402. That is, letting k1 be a proportionality constant, the following equation holds:

$$Idet = k1 \times Iout \qquad (1)$$

(4. Boosted Voltage Adjustment Unit—Control Current Generation Circuit)

The control current generation circuit 104 generates a control current Icntl having a magnitude according to the detection current Idet. More specifically, the control current generation circuit 104 includes NMOS transistors Q405, Q406, Q407, Q408, PMOS transistors Q403, Q404, and a constant current source 402.

First, the relation of coupling of the control current generation circuit 104 will be described. The NMOS transistors Q405, Q407 and the PMOS transistor Q403 are each diode-coupled. The NMOS transistor Q405 is coupled between the drain (node N401) of the PMOS transistor Q402 and the ground node GND. The NMOS transistors Q406, Q407 are coupled in parallel between an output node N403 of the constant current source 402 and the ground node GND. The gates of the NMOS transistors Q405, Q406 are coupled to each other. The PMOS transistor Q403 and the NMOS transistor Q408 are coupled in series in this order between the output node 602 of the boosted voltage supply circuit 400 and the ground node GND. The PMOS transistor Q404 is coupled between the output node 602 of the boosted voltage supply circuit 400 and the voltage dividing node 610 (the coupling node between the resistance elements R401 and R402) of the voltage dividing circuit 102. The gates of the PMOS transistors Q403, Q404 are coupled to each other.

According to the above configuration, the NMOS transistors Q405, Q406 configure a current mirror, the NMOS transistors Q407, Q408 configure a current mirror, and the PMOS transistors Q403, Q404 configure a current mirror. Therefore, a current flowing through the NMOS transistor Q406 is expressed as k2×Idet, where k2 is a proportionality constant. A current flowing through the NMOS transistor Q407 is obtained by subtracting the current flowing through the NMOS transistor Q406 from an output current Icnst of the constant current source 402, and therefore expressed as Icnst−k2×Idet. Further, the control current Icntl flowing through the PMOS transistor Q404 is expressed as follows.

$$\begin{aligned} Icntl &= k3 \times (Icnst - k2 \times Idet) \\ &= k3 \times (Icnst - k2 \times k1 \times Iout) \end{aligned} \qquad (2)$$

where k3 is a proportionality constant. The control current Icntl flows into the voltage dividing node 610 of the voltage dividing circuit 102; therefore, letting IR401 and IR402 be respective currents flowing through the resistance elements R401 and R402 configuring the voltage dividing circuit 102, the following equation holds:

$$IR401 = IR402 - Icnt1 \quad (3)$$
$$= IR402 - k3 \times Icnst + k1 \times k2 \times k3 \times Iout$$

[Operation of Boosted Voltage Supply Circuit]

Next, the operation of the boosted voltage supply circuit 400 will be described using a specific numerical example. In the following description, the output impedance of the charge pump 201 is 10 kΩ. The write current per memory cell is 10 μA. The reference voltage N202 outputted from the reference voltage circuit 204 is 1.0 V. The resistance value of the resistance element R401 configuring the voltage dividing circuit 102 is 989 kΩ, and the resistance value of the resistance element R402 is 100 kΩ. The size ratio between the channel widths W of the PMOS transistors Q401 and Q402 is W_Q401:W_Q402=50:1. The size ratio between the channel widths W of the NMOS transistors Q405 and Q406 is W_Q405:W_Q406=2:1. The channel widths W of the NMOS transistors Q406, Q407, Q408 are equal to one another. The channel widths W of the PMOS transistors Q403, Q404 are equal to each other. The output current Icnst of the constant current source 402 is 1 μA. The voltage level of the boosted voltage outputted from the charge pump 201 is set to 10 V so as to be sufficient for writing.

FIG. 7 is a table associating the values of currents flowing through the transistors in the boosted voltage supply circuit in FIG. 6 with the write data. FIG. 8 is a table associating the values of voltages across the resistance element R401 of the voltage dividing circuit in FIG. 6 and write voltages with the write data. In the calculation example of FIGS. 7 and 8, a voltage drop caused by the output impedance of the charge pump 201 is not taken into account. Hereinafter, referring to FIGS. 6 to 8, a case where all the write data signals D0 to D3 are "0", that is, all the output signals W0 to W3 of the writing circuit 302 are at the H level will be representatively described.

First, the voltage level of the voltage dividing node 610 (the coupling node between the resistance elements R401 and R402) of the voltage dividing circuit 102 becomes equal to the reference voltage N202 outputted from the reference voltage circuit 204, that is, 1.0 V, as a result of feedback of the output of the comparator 203. Therefore, the current flowing through the resistance element R402 is 1.0V/100kΩ=10 μA. The 10 μA current also flows through the resistance element R401 (more precisely, the current flowing through the resistance element R401 is a value obtained by subtracting the control current Icntl flowing into the voltage dividing node 610 from the 10 μA current flowing through the resistance element R402, as will be described later).

If all the write data signals D0 to D3 are "0", all the output signals W0 to W3 of the writing circuit 302 are "H", and all the NMOS transistors Q300 to Q303 are turned on, as described with FIG. 5. In this case, the write currents I0 to I3 flowing through the selected memory cells MC[0, 0] to MC[0, 3] are each 10 μA, and are therefore 40 μA in total. At this time, a current of 50 μA, which is the sum of the 10 μA current flowing through the voltage dividing resistor R402 and the 40 μA current flowing through the memory cells, flows through the PMOS transistor Q401 in the current detection circuit 103.

A current of 1 μA flows through the PMOS transistor Q402 configuring the current mirror with the PMOS transistor Q401, in accordance with the ratio (50:1) between the channel widths W of the PMOS transistors Q401 and Q402 (k1=1/50 in the equation (1)). The 1 μA current also flows through the NMOS transistor Q405 coupled in series with the PMOS transistor Q402.

A current of 500 nA flows through the NMOS transistor Q406 configuring the current mirror with the NMOS transistor Q405, in accordance with the ratio (2:1) between the channel widths W of the NMOS transistors Q405 and Q406 (k2=1/2 in the equation (2)). A current of 500 nA obtained by subtracting the 500 nA current flowing through the NMOS transistor Q406 from the 1 μA which is an output current Icnst of the constant current source 402 flows through the NMOS transistor Q407.

A current of 500 nA flows through the NMOS transistor Q408 configuring the current mirror with the NMOS transistor Q407, in accordance with the ratio (1:1) between the channel widths W of the NMOS transistors Q407 and Q408 (k3=1 in the equation (2)). The 500 nA current also flows through the PMOS transistor Q403 coupled in series with the NMOS transistor Q408.

A current of 500 nA flows through the PMOS transistor Q404 configuring the current mirror with the PMOS transistor Q403, in accordance with the ratio (1:1) between the channel widths W of the PMOS transistors Q403 and Q404. Therefore, the 500 nA control current Icntl flows into the voltage dividing node 610 (see the equation (2)).

The current IR401 flowing through the resistance element R401 configuring the voltage dividing circuit 102 is a value obtained by subtracting the control current Icntl (500 nA) from the current IR402 (10 μA) flowing through the resistance element R402. That is, a current of 9.5 μA flows through the resistance element R401. Accordingly, a voltage across the resistance element R401 is 9.5 μA×989 kΩ≈9.4V. Therefore, the voltage (i.e., the write voltage VW) of the output node 602 of the boosted voltage supply circuit 400 is 10.4 V which is the sum of the 9.4V voltage across the resistance element R401 and the 1V voltage across the resistance element R402.

In the case of the other write data as well, the voltage (write voltage VW) of the output node 602 of the boosted voltage supply circuit 400 can be calculated with the same procedure. From a qualitative point of view, as the write current IW increases (i.e., as the output current Iout of the charge pump 201 increases), the detection current Idet detected by the current detection circuit 103 increases (see the equation (1)). With the increase in the detection current Idet, the control current Icntl flowing into the voltage dividing node 610 of the voltage dividing circuit 102 (i.e., the current flowing through the PMOS transistor Q404) decreases (see the equation (2)), and the current IR401 flowing through the resistance element R401 increases (see the equation (3)). Consequently, as the write current IW increases, the voltage (write voltage VW) of the output node 602 of the boosted voltage supply circuit 400 increases.

In the above result, the voltage drop caused by the output impedance of the charge pump 201 is not taken into account. In reality, as the write current IW increases, the output voltage of the charge pump 201 decreases due to the voltage drop caused by the output impedance, which cancels out the effect of the voltage increase by the boosted voltage adjustment unit 401. Consequently, the actual write voltage VW is maintained approximately constant regardless of the magnitude of the write current IW.

More specifically, assuming that the output impedance of the charge pump 201 is 10 kΩ, as the write current increases by 10 μA, the output voltage of the charge pump 201 decreases by 0.1V. Consequently, the actual write voltage VW (i.e., the voltage of the output node 602 of the boosted voltage supply circuit 400) is maintained at a constant value of 10.0 V.

Figure 9:
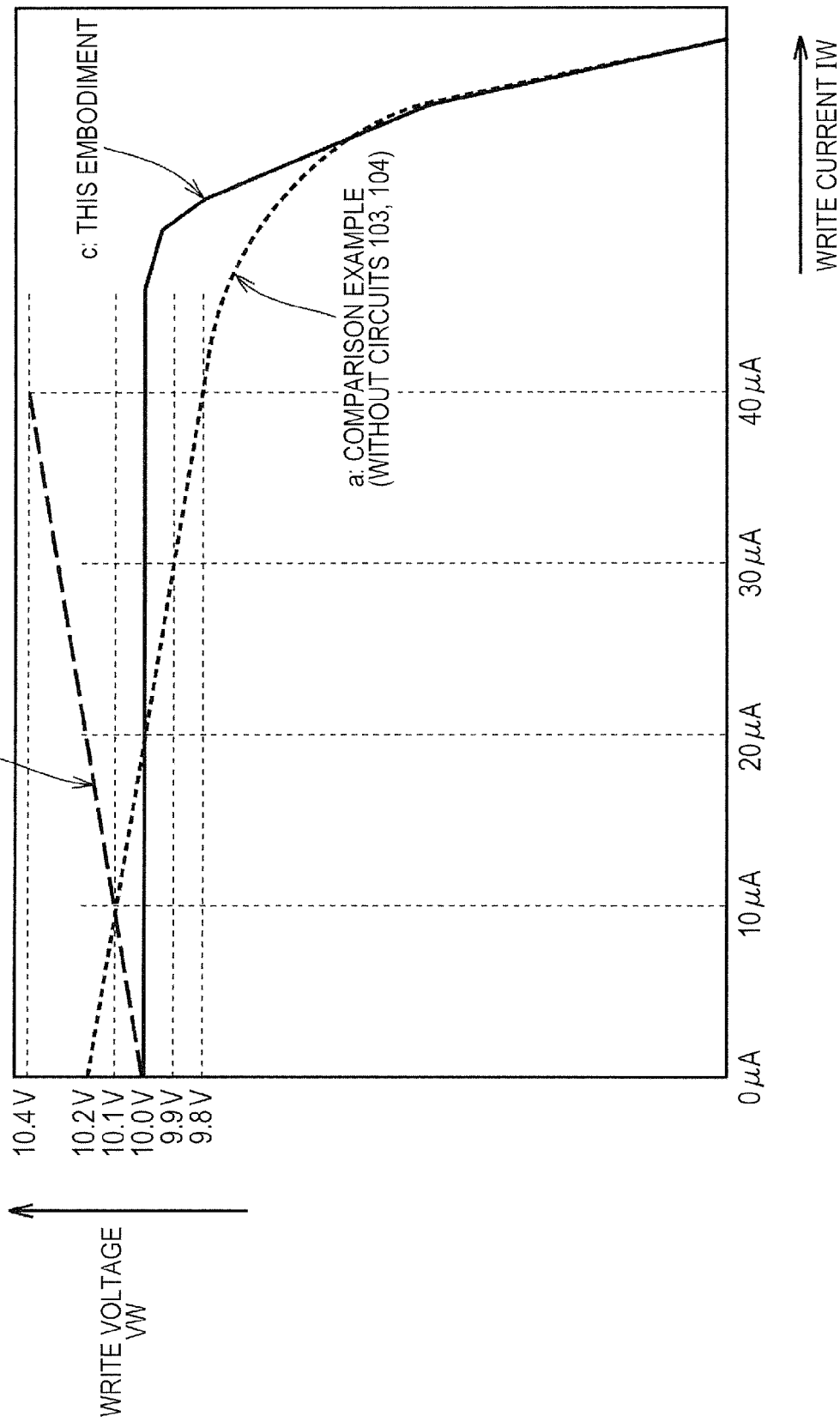
FIG. 9 is a diagram showing the relationship between a write current IW and a write voltage VW outputted from the boosted voltage supply circuit in FIG. 6.

FIG. 9 is a diagram showing the relationship between the write current IW and the write voltage VW outputted from the boosted voltage supply circuit in FIG. 6. Graphs b, c in FIG. 9 are drawn based on the numerical example of FIGS. 7 and 8.

In graph b according to this embodiment, the voltage drop caused by the output impedance of the charge pump 201 is not taken into account. Graph b is drawn by plotting the result shown in the table of FIG. 8 as it is.

In graph c according to this embodiment, the voltage drop caused by the output impedance of the charge pump 201 is taken into account. As described above, assuming that the output impedance of the charge pump 201 is 10 kΩ, as the write current increases by 10 μA, the voltage decreases by 0.1V due to the output impedance. Consequently, the write voltage VW is maintained at an approximately constant voltage value regardless of write data (the magnitude of the write current).

Graph a is drawn based on a comparison example in which the current detection circuit 103 and the control current generation circuit 104 in FIG. 6 are not provided. In this case, as the write current IW increases, the voltage drop caused by the output impedance of the charge pump 201 increases, and the write voltage VW outputted from the boosted voltage supply circuit 400 decreases.

In the case of graph a, the resistance value of the resistance element R401 configuring the voltage dividing circuit 102 is 900 kΩ, the resistance value of the resistance element R402 is 100 kΩ, and the reference voltage N202 outputted from the reference voltage circuit 204 is 1.02 V. In this case, the voltage N201 of the voltage dividing node 610 is 1.02 V, and the voltage VW of the output node 602 of the boosted voltage supply circuit 400 is 10.2 V. Further, assuming that the output impedance of the charge pump 201 is 10 kΩ, as the write current increases by 10 μA, the output voltage of the charge pump 201 decreases by 0.1V; therefore, the characteristic of graph a in FIG. 9 is obtained.

[Effect of First Embodiment]

As described above, the semiconductor device according to the first embodiment includes the current detection circuit 103 for detecting the output current Iout of the charge pump 201 and the control current generation circuit 104 for generating the control current Icntl which decreases as the detected output current Iout increases. The generated control current Icntl flows into the voltage dividing node 610 of the voltage dividing circuit 102. Thereby, the magnitude of the write voltage VW outputted from the boosted voltage supply circuit 400 can be maintained approximately constant regardless of the write current IW. Since the magnitude of the control current Icntl is negligible compared to the magnitude of the write current IW, the semiconductor device according to this embodiment does not uselessly increase the power consumption.

[First Modification]

In FIG. 6, a node (hereinafter referred to as a control node) into which the control current Icntl flows in the voltage dividing circuit 102 corresponds to the voltage dividing node 610 from which the divided voltage N201 is outputted. On the other hand, even if the control node differs from the voltage dividing node 610, it is possible to provide approximately the same advantageous effect as above. More specifically, the control current Icntl can flow into any coupling node between a plurality of series-coupled resistance elements configuring the voltage dividing circuit 102.

[Second Modification]

In the above embodiment, the stacked gate memory device is used as each memory cell. On the other hand, if the split gate memory device is used as each memory cell, the boosted voltage supply circuit 400 can also be used. Hereinafter, the coupling between the memory array 301 and the boosted voltage supply circuit 400 in this case will be briefly described.

Figure 10:
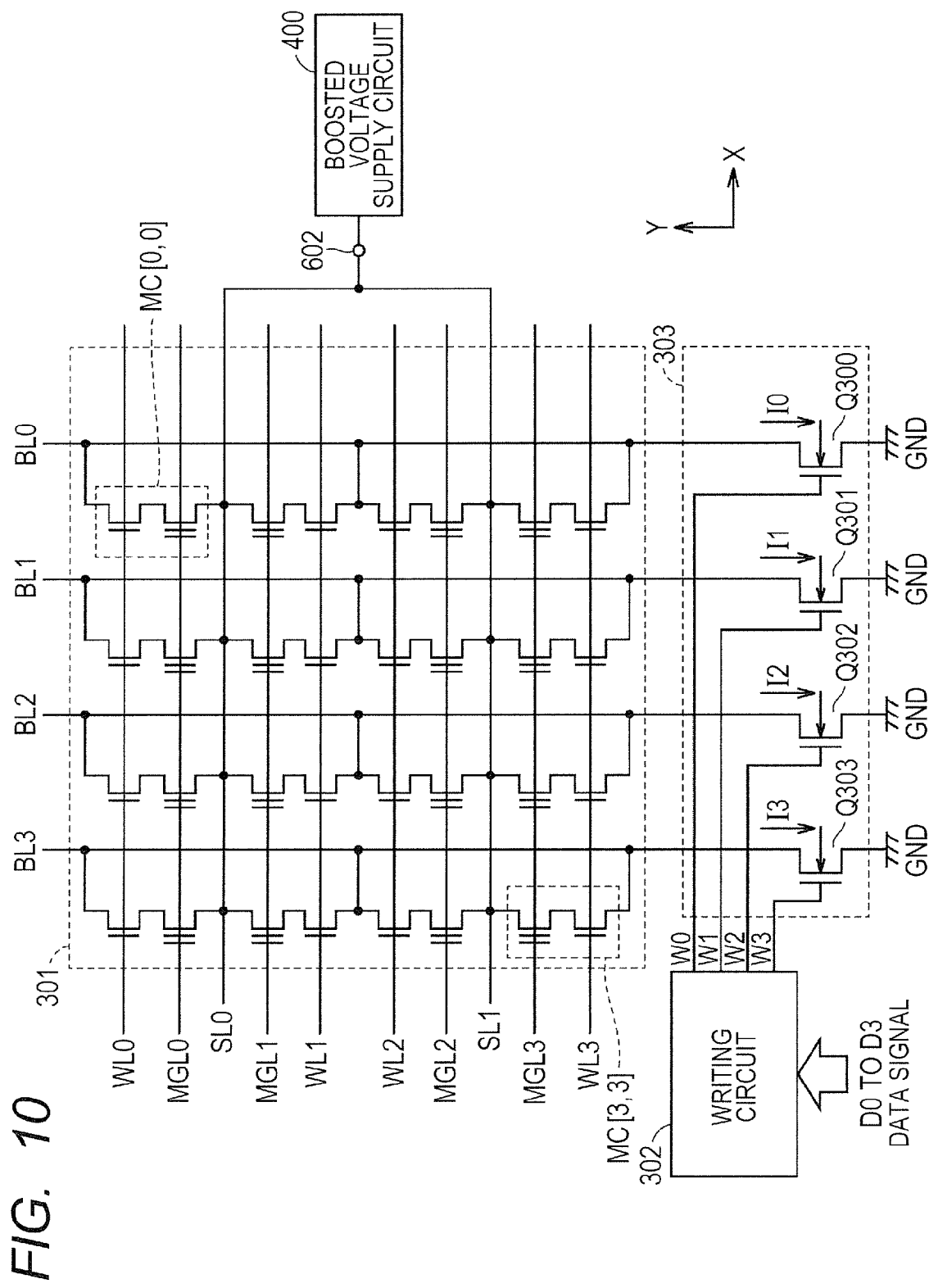
FIG. 10 is a diagram showing a modification of FIG. 5.

FIG. 10 is a diagram showing a modification of FIG. 5. As in FIG. 5, 16 memory cells MC[0, 0] to MC[3, 3] are representatively shown in the flash memory array 301. In FIG. 10, the split gate memory device is used as each memory cell.

Referring to FIG. 10, the bit lines BL0 to BL3 are arranged extending in the Y direction and respectively corresponding to the columns of the flash memory array 301. Each bit line BL is coupled to the drain region (or the source region) on the control gate side of each memory cell MC of the corresponding column.

The word lines WL0 to WL3 are arranged extending in the X direction and respectively corresponding to the rows of the flash memory array 301. Each word line WL is coupled to the control gate of each memory cell MC of the corresponding row.

Memory gate selection lines MGL0 to MGL3 are arranged extending in the X direction and respectively corresponding to the rows of the flash memory array 301. Each memory gate selection line MGL is coupled to the memory gate of each memory cell MC of the corresponding row.

The source lines SL0, SL1 are provided extending in the row direction (X direction) of the flash memory array 301. In FIG. 10, one source line SL is arranged every two rows of the flash memory array 301 and coupled to the source region (or the drain region) on the memory gate side of each memory cell MC provided in the corresponding row. Further, the source lines SL0, SL1 are coupled to the output node 602 of the boosted voltage supply circuit 400 through the high voltage applying circuit 307 (not shown).

Since the relation of coupling of the Y-selector circuit 303 and the writing circuit 302 are the same as in FIG. 5, the same or equivalent parts are denoted by the same reference numerals, and their description will not be repeated.

Second Embodiment

[Configuration of Boosted Voltage Supply Circuit]

Figure 11:
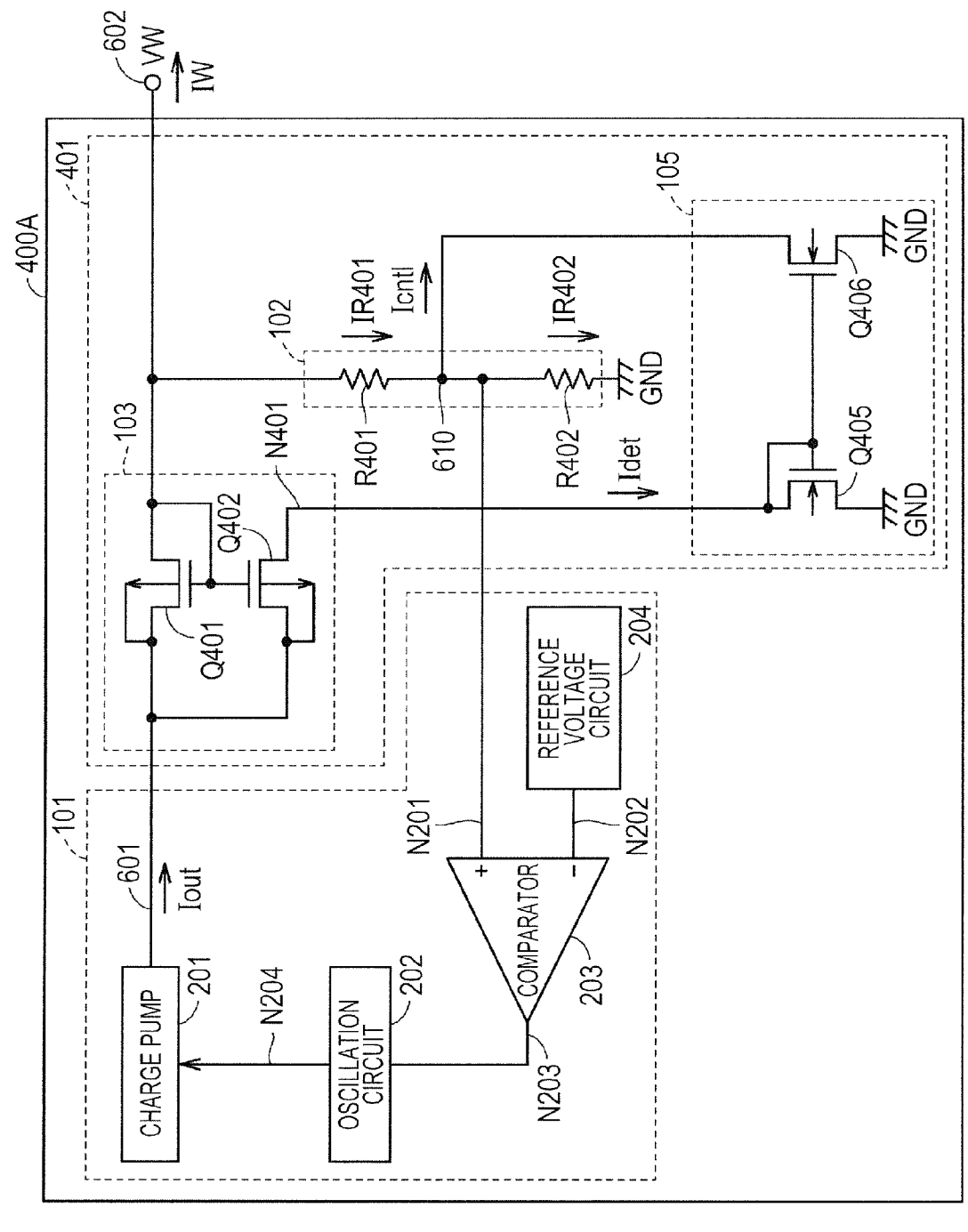
FIG. 11 is a diagram showing the configuration of a boosted voltage supply circuit 400A in a semiconductor device according to a second embodiment.

FIG. 11 is a diagram showing the configuration of a boosted voltage supply circuit 400A in a semiconductor device according to the second embodiment. The boosted voltage supply circuit 400A in FIG. 11 is a modification of the boosted voltage supply circuit 400 in FIG. 6, and includes a control current generation circuit 105 in place of the control current generation circuit 104 according to the first embodiment shown in FIG. 6.

More specifically, referring to FIG. 11, the control current generation circuit 105 includes NMOS transistors Q405, Q406. The NMOS transistor Q405 is diode-coupled, and coupled between the drain (node N401) of the PMOS transistor Q402 and the ground node GND. The NMOS transistor Q406 is coupled between the voltage dividing node 610 (the coupling node between the resistance elements R401 and R402) of the voltage dividing circuit 102 and the ground node GND (i.e., coupled in parallel with the resistance element R402). The gates of the NMOS transistors Q405, Q406 are coupled to each other.

Since the other configuration in FIG. 11 is the same as in FIG. 6, the same or equivalent parts are denoted by the same reference numerals, and their description will not be repeated.

According to the above configuration, the NMOS transistors Q405, Q406 configure a current mirror. Therefore, letting k2 be a proportionality constant, a control current Icntl flowing through the NMOS transistor Q406 is expressed as follows.

$$Icntl = k2 \times Idet \qquad (4)$$
$$= k2 \times k1 \times Iout$$

The control current Icntl is drawn from the voltage dividing node 610 of the voltage dividing circuit 102; therefore, the current IR401 flowing through the resistance element R401 of the voltage dividing circuit 102 is expressed as follows.

$$IR401 = IR402 + Icntl \qquad (5)$$
$$= IR402 + k1 \times k2 \times Iout$$

[Operation of Boosted Voltage Supply Circuit]

Next, the operation of the boosted voltage supply circuit 400A according to the second embodiment will be described showing a specific numerical example. In the following description, the resistance value of the resistance element R401 configuring the voltage dividing circuit is 890 kΩ, and the resistance value of the resistance element R402 is 100 kΩ. The size ratio between the channel widths W of the NMOS transistors Q405 and Q406 is W_Q405: W_Q406=40:23. The other numerical values are the same as in the first embodiment.

FIG. 12 is a table associating the values of currents flowing through the transistors in the boosted voltage supply circuit in FIG. 11 with the write data. FIG. 13 is a table associating the values of voltages across the resistance element R401 of the voltage dividing circuit in FIG. 11 and write voltages with the write data. In the calculation example of FIGS. 12 and 13, the voltage drop caused by the output impedance of the charge pump 201 is not taken into account. Hereinafter, referring to FIGS. 11 to 13, a case where all the write data signals D0 to D3 are "0", that is, all the output signals W0 to W3 of the writing circuit 302 are at the H level will be representatively described.

First, the voltage level of the voltage dividing node 610 (the coupling node between the resistance elements R401 and R402) of the voltage dividing circuit 102 becomes equal to the reference voltage N202 outputted from the reference voltage circuit 204, that is, 1.0 V, as a result of feedback of the output of the comparator 203. Therefore, the current flowing through the resistance element R402 is 1.0V/100 kΩ=10 μA. The 10 μA current also flows through the resistance element R401 (more precisely, the current flowing through the resistance element R401 is a value obtained by adding the control current Icntl drawn from the voltage dividing node 610 to the 10 μA current flowing through the resistance element R402, as will be described later).

If all the write data signals D0 to D3 are "0", all the output signals W0 to W3 of the writing circuit 302 are "H", and all the NMOS transistors Q300 to Q303 are turned on, as described with FIG. 5. In this case, the write currents I0 to I3 flowing through the selected memory cells MC[0, 0] to MC[0, 3] are each 10 μA, and are therefore 40 μA in total. At this time, a current of 50 μA, which is the sum of the 10 μA current flowing through the voltage dividing resistor R402 and the 40 μA current flowing through the memory cells, flows through the PMOS transistor Q401 in the current detection circuit 103.

A current of 1 μA flows through the PMOS transistor Q402 configuring the current mirror with the PMOS transistor Q401, in accordance with the ratio (50:1) between the channel widths W of the PMOS transistors Q401 and Q402 (k1=1/50 in the equation (4)). The 1 μA current also flows through the NMOS transistor Q405 coupled in series with the PMOS transistor Q402.

A current of 575 nA flows through the NMOS transistor Q406 configuring the current mirror with the NMOS transistor Q405, in accordance with the ratio (40:23) between the channel widths W of the NMOS transistors Q405 and Q406 (k2=23/40 in the equation (4)). Therefore, the 575 nA control current Icntl is drawn from the voltage dividing node 610 (see the equation (4)).

The current IR401 flowing through the resistance element R401 configuring the voltage dividing circuit 102 is a value obtained by adding the control current Icntl (575 nA) to the current IR402 (10 μA) flowing through the resistance element R402. That is, a current of 10.575 μA flows through the resistance element R401. Accordingly, a voltage across the resistance element R401 is 10.575 μA×890 kΩ≈9.4V. Therefore, the voltage (i.e., the write voltage VW) of the output node 602 of the boosted voltage supply circuit 400A is 10.4 V which is the sum of the 9.4V voltage across the resistance element R401 and the 1V voltage across the resistance element R402.

In the case of the other write data as well, the voltage (write voltage VW) of the output node 602 of the boosted voltage supply circuit 400A can be calculated with the same procedure. From a qualitative point of view, as the write current IW increases (i.e., as the output current Iout of the charge pump 201 increases), the detection current Idet detected by the current detection circuit 103 increases (see the equation (1)). With the increase in the detection current Idet, the control current Icntl drawn from the voltage dividing node 610 of the voltage dividing circuit 102 (i.e., the current flowing through the NMOS transistor Q406) increases (see the equation (4)), and the current IR401 flowing through the resistance element R401 increases (see the equation (5)). Consequently, as the write current IW increases, the voltage (write voltage VW) of the output node 602 of the boosted voltage supply circuit 400A increases.

In the above result, the voltage drop caused by the output impedance of the charge pump 201 is not taken into account. In reality, as the write current IW increases, the output voltage of the charge pump 201 decreases due to the voltage drop caused by the output impedance, which cancels out the effect of the voltage increase by the boosted voltage adjustment unit 401. Consequently, the actual write voltage VW is maintained approximately constant regardless of the magnitude of the write current IW.

More specifically, assuming that the output impedance of the charge pump 201 is 10 kΩ, as the write current increases by 10 μA, the output voltage of the charge pump 201 decreases by 0.1V. Consequently, the actual write voltage VW (i.e., the voltage of the output node 602 of the boosted voltage supply circuit 400A) is maintained at a constant value of 10.0 V.

[Effect of Second Embodiment]

As described above, the semiconductor device according to the second embodiment includes the current detection circuit 103 for detecting the output current Iout of the charge pump 201 and the control current generation circuit 105 for generating the control current Icntl which increases as the detected output current Iout increases. The generated control current Icntl is drawn from the voltage dividing node 610 of the voltage dividing circuit 102. Thereby, the magnitude of the write voltage VW outputted from the boosted voltage supply circuit 400A can be maintained approximately constant regardless of the write current IW. Since the magnitude of the control current Icntl is negligible compared to the magnitude of the write current IW, the semiconductor device according to this embodiment does not uselessly increase the power consumption.

The boosted voltage supply circuit 400A in FIG. 11 advantageously has a simpler configuration than the boosted voltage supply circuit 400 in FIG. 6. However, the boosted voltage supply circuit 400 in FIG. 6 can advantageously suppress variation in the manufacturing process by configuring the constant current source 402 to be able to trim the output current Icnst.

[Modification]

As in the first embodiment, even if a node from which the control current Icntl is drawn in the voltage dividing circuit 102 differs from the voltage dividing node 610, it is possible to provide approximately the same advantageous effect as above. Further, each memory cell may be the stacked gate memory device or the split gate memory device.

Third Embodiment

[Configuration of Boosted Voltage Supply Circuit]

Figure 14:
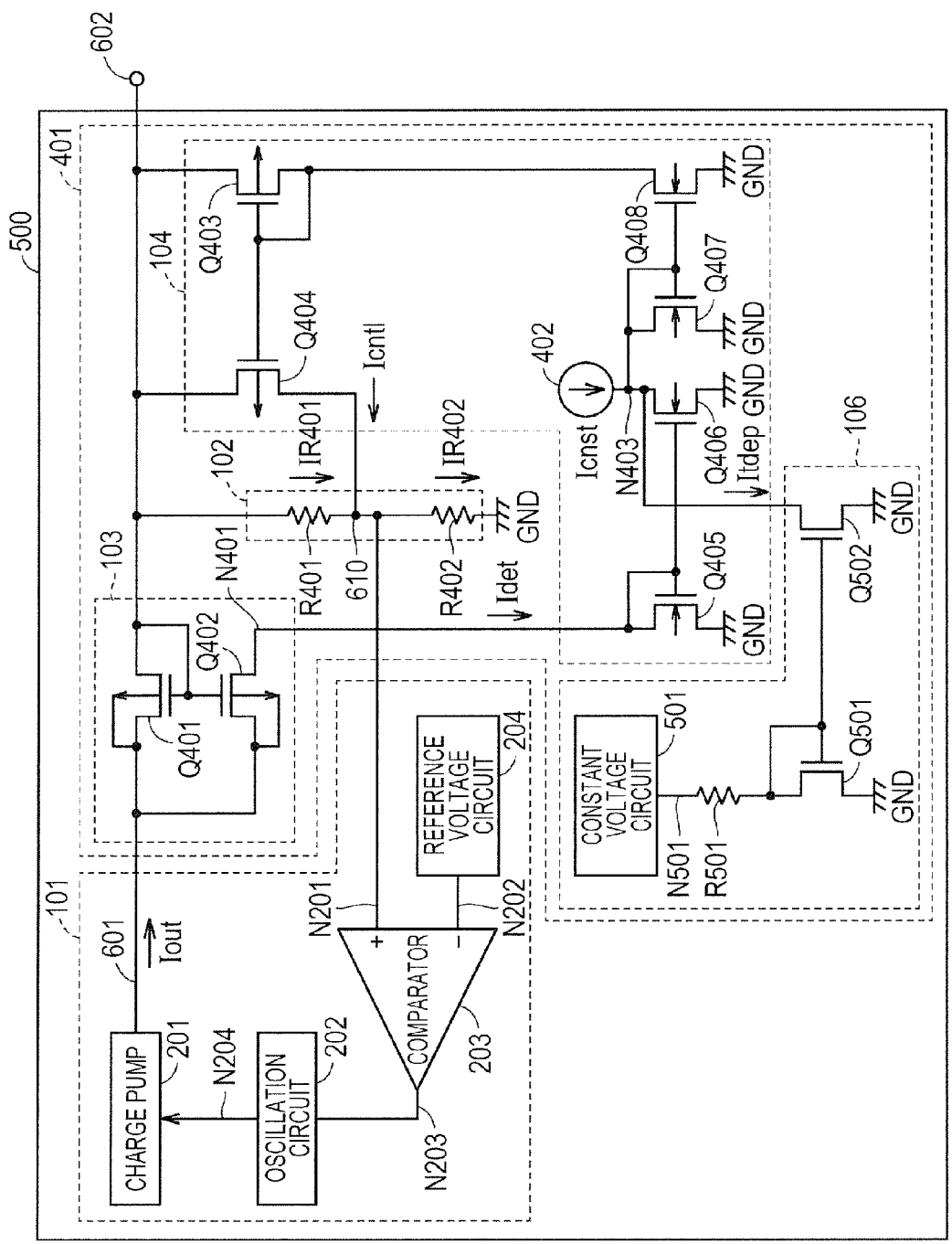
FIG. 14 is a diagram showing the configuration of a boosted voltage supply circuit 500 in a semiconductor device according to a third embodiment.

FIG. 14 is a diagram showing the configuration of a boosted voltage supply circuit 500 in a semiconductor device according to the third embodiment. The boosted voltage supply circuit 500 in FIG. 14 is a modification of the boosted voltage supply circuit 400 in FIG. 6. More specifically, the boosted voltage supply circuit 500 in FIG. 14 differs from the boosted voltage supply circuit 400 in FIG. 6 in that the boosted voltage supply circuit 500 further includes a temperature-dependent current source 106 which increases an output current as a temperature increases.

Referring to FIG. 14, the temperature-dependent current source 106 includes a constant voltage circuit 501, a resistance element R501, and NMOS transistors Q501, Q502. The constant voltage circuit 501 is configured with, e.g., a BGR (Band Gap Reference) circuit, and outputs a constant voltage regardless of the power supply voltage and temperature change. The resistance element R501 is made of e.g. polysilicon, and has little dependence on the temperature. One end of the resistance element R501 is coupled to an output node N501 of the constant voltage circuit 501. The NMOS transistor Q501 is diode-coupled and coupled between the other end of the resistance element R501 and the ground node GND. The NMOS transistor Q502 is coupled between the output node N403 of the constant current source 402 and the ground node GND. The NMOS transistors Q501, Q502 have their gates coupled to each other, and thereby configure a current mirror.

According to the configuration of the temperature-dependent current source 106, since the threshold voltage of the NMOS transistor Q501 decreases as the temperature increases, an output current Itdep of the temperature-dependent current source 106 increases as the temperature increases. Since the output current Itdep is further drawn from the output node N403 of the constant current source 402, the control current Icntl in the equation (2) is rewritten as as follows.

$$Icntl = k3 \times (Icnst - Itdep - k2 \times k1 \times Iout) \qquad (6)$$

That is, the control current Icntl decreases as the temperature increases.

Since the rest of FIG. 14 is the same as in FIG. 6, the same or equivalent parts are denoted by the same reference numerals, and their description will not be repeated.

[Operation of Boosted Voltage Supply Circuit]

Next, the operation of the boosted voltage supply circuit 500 according to the third embodiment will be described showing a specific numerical example. In the following description, the voltage of the output node N501 of the constant voltage circuit 501 is 2 V, and the output current Icnst of the constant current source 402 is 2 µA. The resistance value of the resistance element R501 is 260 kΩ. The size ratio (W_Q501:W_Q502) between the channel widths W of the NMOS transistors Q501 and Q502 is 5:1. The other numerical values are the same as in the first embodiment.

FIG. 15 is a table associating the values of currents flowing through the transistors in the boosted voltage supply circuit in FIG. 14 with temperatures. FIG. 16 is a table associating the values of voltages across the resistance element R401 of the voltage dividing circuit in FIG. 14 and write voltages with temperatures. In the calculation example of FIGS. 15 and 16, all the write data signals D0 to D3 are "0". Further, the voltage drop caused by the output impedance of the charge pump 201 is not taken into account.

Referring to FIGS. 14 to 16, if all the write data signals D0 to D3 are "0", the total 40 µA write current IW flows. At this time, a current of 50 µA, which is the sum of the 10 µA current flowing through the voltage dividing resistor R402 and the 40 µA current flowing through the memory cells, flows through the PMOS transistor Q401 in the current detection circuit 103.

A current of 1 µA flows through the PMOS transistor Q402 configuring the current mirror with the PMOS transistor Q401, in accordance with the ratio (50:1) between the channel widths W of the PMOS transistors Q401 and Q402 (k1=1/50 in the equation (6)). The 1 µA current also flows through the NMOS transistor Q405 coupled in series with the PMOS transistor Q402.

A current of 500 nA flows through the NMOS transistor Q406 configuring the current mirror with the NMOS transistor Q405, in accordance with the ratio (2:1) between the channel widths W of the NMOS transistors Q405 and Q406 (k2=1/2 in the equation (6)).

Assume that the threshold voltage of the NMOS transistor Q501 is 0.7 V at a temperature of 25° C. and the temperature dependency of the threshold voltage is −0.3 V/100° C. In this assumption, the threshold voltage at −40° C. is 0.7V+ 0.195V=0.895V, and the threshold voltage at 125° C. is 0.7V−0.3V=0.4V. Therefore, a current flowing through the resistance element R501 is (2V−0.895V)/260 kΩ=4.2 µA at −40° C. The 4.2 µA current also flows through the NMOS transistor Q501 coupled in series with the resistance element R501. Currents flowing through the NMOS transistor Q501 at temperatures of 25° C. and 125° C. can be calculated in the same way as above. Hereinafter, a case at a temperature of −40° C. will be described.

A current Itdep of 840 nA flows through the NMOS transistor Q502 configuring the current mirror with the NMOS transistor Q501, in accordance with the ratio (5:1) between the channel widths W of the NMOS transistors Q501 and Q502. Therefore, a current of 660 nA obtained by subtracting the 500 nA current flowing through the NMOS transistor Q406 and the current Itdep (840 nA) flowing through the NMOS transistor Q502 from the 2 µA which is an output current Icnst of the constant current source 402 flows through the NMOS transistor Q407.

A current of 660 nA flows through the NMOS transistor Q408 configuring the current mirror with the NMOS transistor Q407, in accordance with the ratio (1:1) between the channel widths W of the NMOS transistors Q407 and Q408 (k3=1 in the equation (6)). The 660 nA current also flows through the PMOS transistor Q403 coupled in series with the NMOS transistor Q408.

A current of 660 nA flows through the PMOS transistor Q404 configuring the current mirror with the PMOS transistor Q403, in accordance with the ratio (1:1) between the channel widths W of the PMOS transistors Q403 and Q404. Therefore, the 660 nA control current Icntl flows into the voltage dividing node 610 (see the equation (6)).

The current IR401 flowing through the resistance element R401 configuring the voltage dividing circuit 102 is a value obtained by subtracting the control current Icntl (660 nA) from the current IR402 (10 µA) flowing through the resistance element R402. That is, a current of 9.34 µA flows through the resistance element R401. Accordingly, a voltage across the resistance element R401 is 9.34 µA×989 kΩ≈9.2V. Therefore, the voltage (i.e., the write voltage VW) of the output node 602 of the boosted voltage supply circuit 500 is 10.2 V which is the sum of the 9.2V voltage across the resistance element R401 and the 1V voltage across the resistance element R402.

The other cases at temperatures of 25° C. and 125° C. are shown in FIGS. 15 and 16. From a qualitative point of view, as the temperature increases, the output current Itdep of the temperature-dependent current source increases, and the control current Icntl decreases (see the equation (6)). Consequently, as the temperature increases, the voltage (write voltage VW) of the output node 602 of the boosted voltage supply circuit 500 increases.

[Effect of Third Embodiment]

In the third embodiment, the control current Icntl flowing into the voltage dividing node 610 of the voltage dividing circuit 102 depends not only on the write current IW but also on the temperature. More specifically, the control current Icntl decreases as the write current IW increases, and decreases as the temperature increases. Consequently, the voltage (write voltage VW) of the output node 602 of the boosted voltage supply circuit 500 is maintained at an approximately constant value with respect to the write current IW as described in the first embodiment, but increases with the increase in the temperature. Hereinafter, the reason to cause the write voltage VW to have the temperature dependency will be described.

Figure 17:
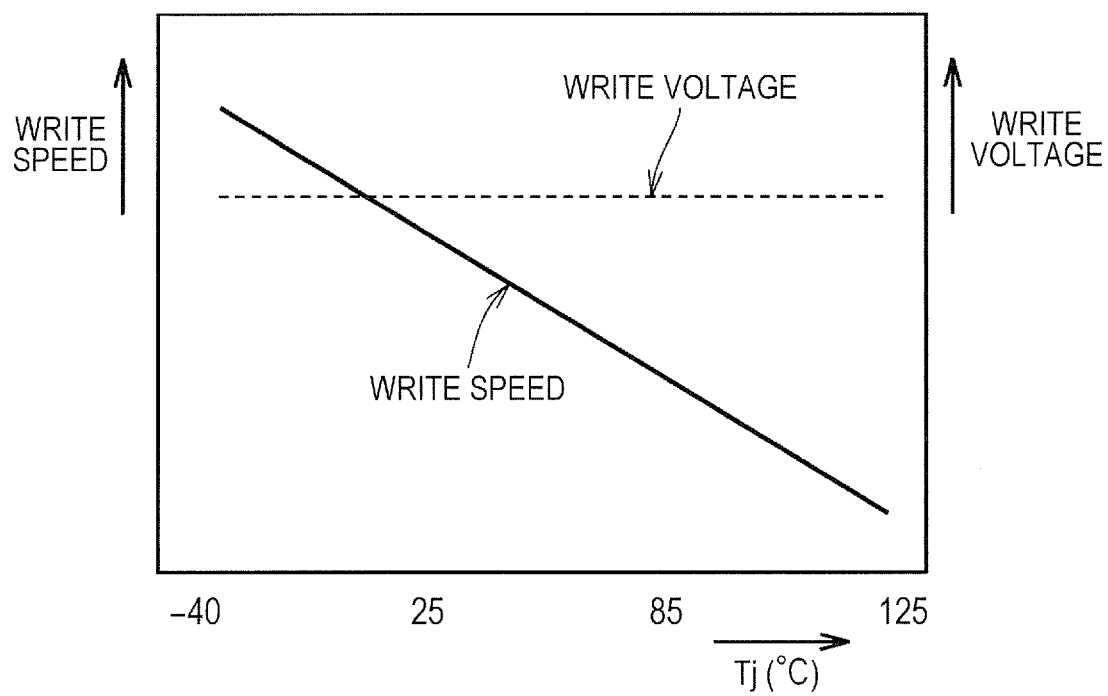
FIG. 17 is a diagram showing the relationship between a write speed, the write voltage, and the temperature in the first embodiment.

FIG. 17 is a diagram showing the relationship between a write speed, the write voltage, and the temperature in the first embodiment. As shown in FIG. 17, the write voltage is constant regardless of the temperature. In this case, the write speed decreases as the temperature increases.

Figure 18:
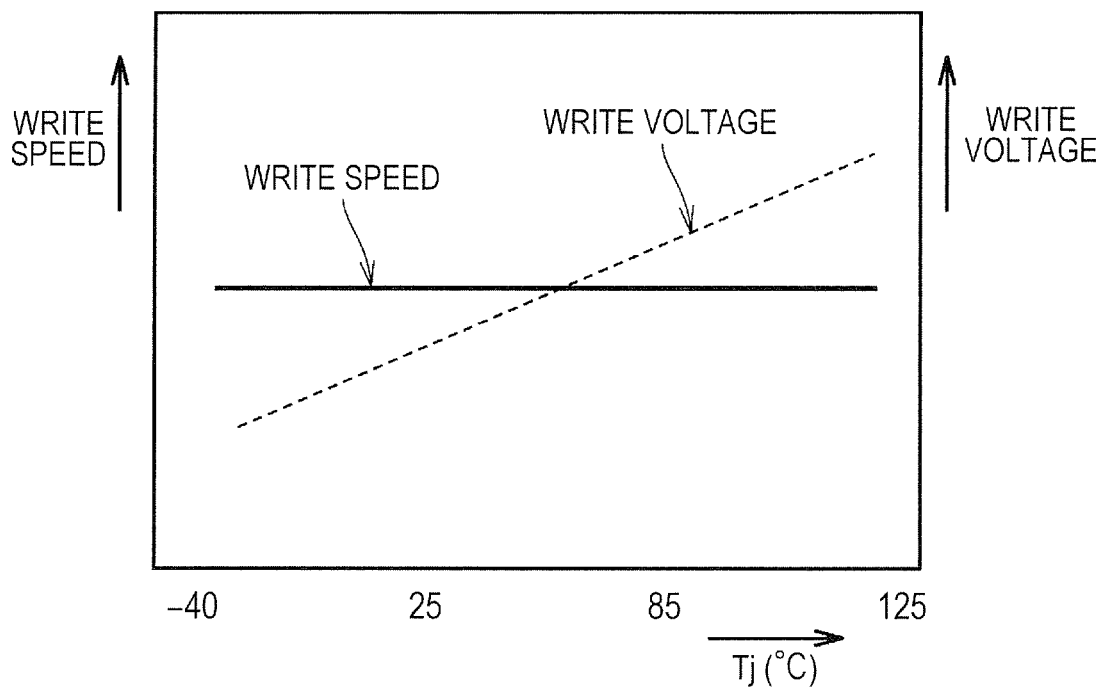
FIG. 18 is a diagram showing the relationship between a write speed, the write voltage, and the temperature in the third embodiment.

FIG. 18 is a diagram showing the relationship between a write speed, the write voltage, and the temperature in the third embodiment. As shown in FIG. 18, the write voltage increases as the temperature increases. In this case, the decrease in the write speed with the increase in the temperature illustrated in FIG. 17 can be compensated for by the increase in the write voltage, so that the write speed can be maintained constant regardless of the temperature. Thus, the third embodiment can provide the advantageous effect of maintaining the write speed constant regardless of the temperature in addition to the advantageous effect of the first embodiment.

[Modification]

As in the first embodiment, even if a node into which the control current Icntl flows in the voltage dividing circuit 102 differs from the voltage dividing node 610, it is possible to provide approximately the same advantageous effect as above. Further, each memory cell may be the stacked gate memory device or the split gate memory device.

Fourth Embodiment

[Configuration of Boosted Voltage Supply Circuit]

Figure 19:
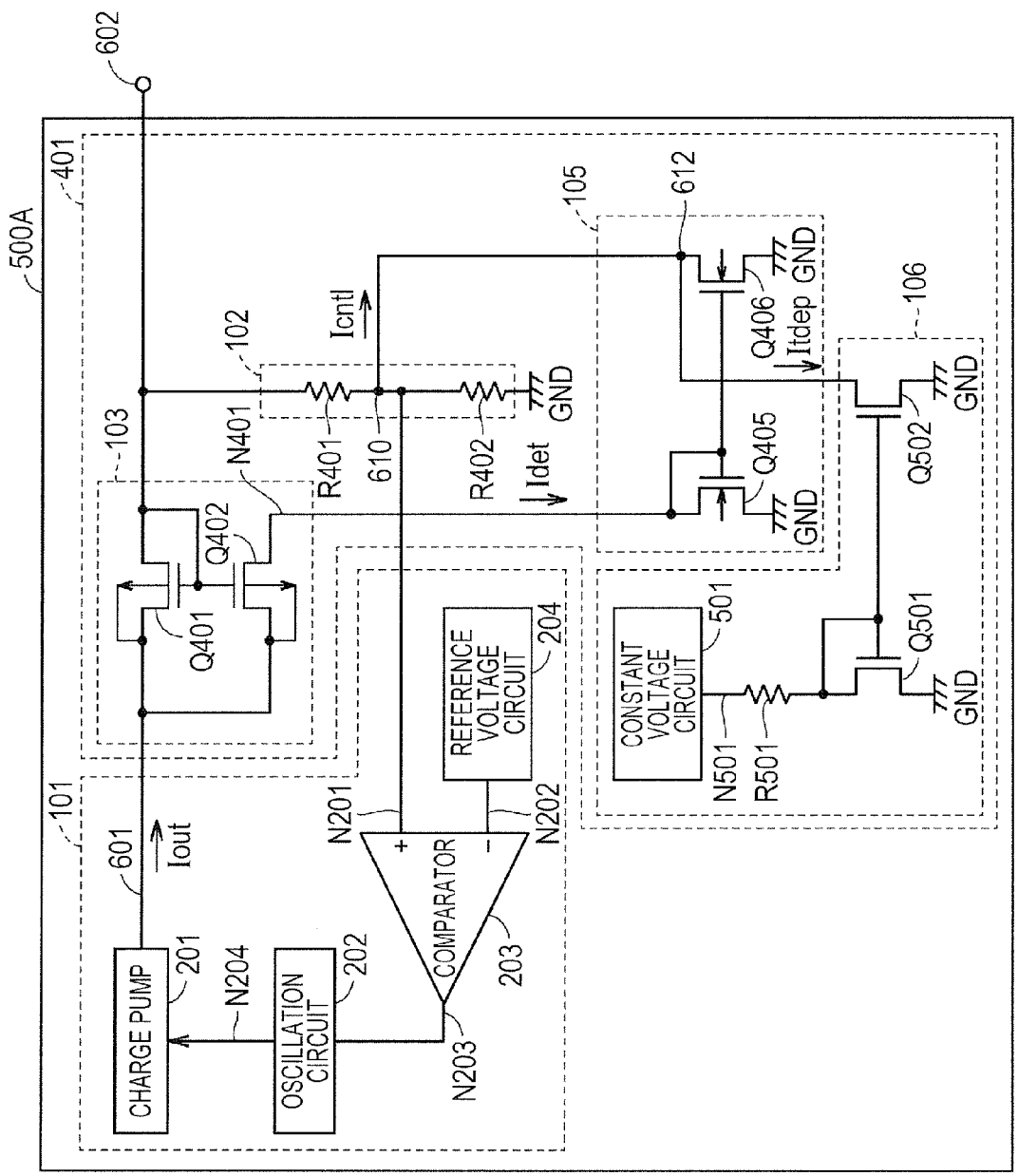
FIG. 19 is a diagram showing the configuration of a boosted voltage supply circuit 500A in a semiconductor device according to a fourth embodiment.

FIG. 19 is a diagram showing the configuration of a boosted voltage supply circuit 500A in a semiconductor device according to the fourth embodiment. The boosted voltage supply circuit 500A in FIG. 19 is a modification of the boosted voltage supply circuit 400A in FIG. 11. More specifically, the boosted voltage supply circuit 500A in FIG. 19 differs from the boosted voltage supply circuit 400A in FIG. 11 in that the boosted voltage supply circuit 500A further includes the temperature-dependent current source 106 which increases the output current as the temperature increases.

Since the configuration of the temperature-dependent current source 106 is the same as in FIG. 14, the same or equivalent parts are denoted by the same reference numerals, and their description will not be repeated. In FIG. 19, the NMOS transistor Q502 is coupled between the drain (node 612) of the NMOS transistor Q406 and the ground node GND.

The equation (4) is rewritten as $$Icntl = k2 \times k1 \times Iout + Itdep \qquad (7)$$

where Itdep is the output current of the temperature-dependent current source 106. That is, the control current Icntl drawn from the voltage dividing node 610 of the voltage dividing circuit 102 increases as the output current Iout of the charge pump 201 (the write current IW) increases, and increases as the output current Itdep of the temperature-dependent current source 106 increases. Since the output current Itdep of the temperature-dependent current source 106 increases as the temperature increases, the control current Icntl drawn from the voltage dividing node 610 increases as the temperature increases.

[Operation of Boosted Voltage Supply Circuit]

Next, the operation of the boosted voltage supply circuit 500A according to the fourth embodiment will be described showing a specific numerical example. In the following description, the voltage of the output node N501 of the constant voltage circuit 501 is 2 V. The resistance value of the resistance element R501 is 260 kΩ. The size ratio (W_Q501:W_Q502) between the channel widths W of the NMOS transistors Q501 and Q502 is 4:1. The resistance value of the resistance element R401 configuring the voltage dividing circuit is 793 kΩ, and the resistance value of the resistance element R402 is 100 kΩ. The size ratio between the channel widths W of the NMOS transistors Q405 and Q406 is W_Q405:W_Q406=40:23. Assume that the threshold voltage of the NMOS transistor Q501 is 0.7 V at a temperature of 25° C. and the temperature dependency of the threshold voltage is −0.3 V/100° C., as in the third embodiment. The other numerical values are the same as in the first embodiment.

FIG. 20 is a table associating the values of currents flowing through the transistors in the boosted voltage supply circuit in FIG. 19 with temperatures. FIG. 21 is a table associating the values of voltages across the resistance element R401 of the voltage dividing circuit in FIG. 19 and write voltages with temperatures. In the calculation example of FIGS. 20 and 21, all the write data signals D0 to D3 are "0". Further, the voltage drop caused by the output impedance of the charge pump 201 is not taken into account.

Referring to FIGS. 19 to 21, if all the write data signals D0 to D3 are "0", the total 40 µA write current IW flows. At this time, a current of 50 µA, which is the sum of the 10 µA current flowing through the voltage dividing resistor R402 and the 40 µA current flowing through the memory cells, flows through the PMOS transistor Q401 in the current detection circuit 103.

A current of 1 µA flows through the PMOS transistor Q402 configuring the current mirror with the PMOS transistor Q401, in accordance with the ratio (50:1) between the channel widths W of the PMOS transistors Q401 and Q402 (k1=1/50 in the equation (7)). The 1 µA current also flows through the NMOS transistor Q405 coupled in series with the PMOS transistor Q402.

A current of 575 nA flows through the NMOS transistor Q406 configuring the current mirror with the NMOS transistor Q405, in accordance with the ratio (40:23) between the channel widths W of the NMOS transistors Q405 and Q406 (k2=23/40 in the equation (7)).

Hereinafter, a case at a temperature of −40° C. will be described. As described in the third embodiment, a current of 4.2 µA flows through the NMOS transistor Q501 coupled in series with the resistance element R501. A current Itdep of 1.05 µA flows through the NMOS transistor Q502 configuring the current mirror with the NMOS transistor Q501, in accordance with the ratio (4:1) between the channel widths W of the NMOS transistors Q501 and Q502. Therefore, the control current Icntl drawn from the voltage dividing node 610 is 1.625 µA which is the sum of the 575 nA current flowing through the NMOS transistor Q406 and the 1.05 µA current Itdep flowing through the NMOS transistor Q502 (see the equation (7)).

The current IR401 flowing through the resistance element R401 configuring the voltage dividing circuit 102 is a value obtained by adding the control current Icntl (1.625 µA) to the current IR402 (10 µA) flowing through the resistance element R402. That is, a current of 11.625 µA flows through the resistance element R401. Accordingly, a voltage across the resistance element R401 is 11.625 µA×793kΩ≈9.2V. Therefore, the voltage (i.e., the write voltage VW) of the output node 602 of the boosted voltage supply circuit 500A is 10.2 V which is the sum of the 9.2V voltage across the resistance element R401 and the 1V voltage across the resistance element R402.

The other cases at temperatures of 25° C. and 125° C. are shown in FIGS. 20 and 21. From a qualitative point of view, as the temperature increases, the output current Itdep of the temperature-dependent current source increases, and the control current Icntl increases (see the equation (7)). Consequently, as the temperature increases, the voltage (write voltage VW) of the output node 602 of the boosted voltage supply circuit 500A increases.

[Effect of Fourth Embodiment]

In the fourth embodiment, the control current Icntl drawn from the voltage dividing node 610 of the voltage dividing circuit 102 depends not only on the write current IW but also on the temperature. That is, the control current Icntl increases as the write current IW increases, and increases as the temperature increases. Consequently, the voltage (write voltage VW) of the output node 602 of the boosted voltage supply circuit 500A is maintained at an approximately constant value with respect to the write current IW as described in the second embodiment, but increases with the increase in the temperature. Thus, by causing the write voltage VW to have the temperature dependency, it is possible to provide the advantageous effect of maintaining the write speed constant regardless of the temperature as described in the third embodiment.

[Modification]

As in the second embodiment, even if a node from which the control current Icntl is drawn in the voltage dividing circuit 102 differs from the voltage dividing node 610, it is possible to provide approximately the same advantageous effect as above. Further, each memory cell may be the stacked gate memory device or the split gate memory device.

While the invention made above by the present inventors has been described specifically based on the illustrated embodiments, the present invention is not limited thereto. It is needless to say that various changes and modifications can be made thereto without departing from the spirit and scope of the invention.

What is claimed is:

1. A semiconductor device, comprising:
   a memory array in which electrically rewritable memory cells are arranged in a matrix; and
   a boosted voltage supply circuit for supplying a boosted voltage to the memory array to pass a write current through a plurality of memory cells subjected to writing during data writing,
   the boosted voltage supply circuit comprising:
   a charge pump for generating the boosted voltage;
   an oscillation circuit for generating a clock signal for driving the charge pump;
   a voltage dividing circuit for outputting a divided voltage of the boosted voltage;
   a comparator for comparing the divided voltage with a reference voltage and performing on-off control of the oscillation circuit based on a comparison result;
   a current detection circuit for detecting an output current of the charge pump; and
   a control current generation circuit for generating a control current having a magnitude according to the detected output current,
   the control current generation circuit further comprising:
   a first transistor coupled in parallel with a first resistance element;
   a constant current source; and
   a second transistor coupled between an output node of the constant current source and a ground node,
   wherein the control current generation circuit is configured to feed or draw the generated control current into or from any coupling node between a plurality of series-coupled resistance elements configuring the voltage dividing circuit.

2. The semiconductor device according to claim 1, wherein the control current generation circuit is configured to draw the control current from the coupling node of the voltage dividing circuit, and
   wherein the control current generation circuit increases the control current generated as the output current detected by the current detection circuit increases.

3. The semiconductor device according to claim 2, wherein the current detection circuit generates a detection current proportional to the output current of the charge pump by using a current mirror,
   wherein the voltage dividing circuit comprises:
   a first resistance element coupled between an output node of the charge pump and the coupling node of the voltage dividing circuit; and
   a second resistance element coupled between the coupling node of the voltage dividing circuit and a ground node, and
   wherein the control current generation circuit comprises a first transistor coupled in parallel with the second resistance element, and is configured to pass a current, as the control current, that is equal or proportional to the detection current of the current detection circuit through the first transistor by using a current mirror.

4. The semiconductor device according to claim 3, wherein the control current generation circuit further comprises a second transistor coupled in parallel with the first transistor and the second resistance element,
wherein the boosted voltage supply circuit further comprises a temperature-dependent current source which increases an output current as a temperature increases, and
wherein the temperature-dependent current source is configured to pass a current, as a part of the control current, that is equal or proportional to the output current of the temperature-dependent current source through the second transistor by using a current mirror.

5. The semiconductor device according to claim 2, wherein the control current generation circuit increases the control current generated as a temperature increases.

6. The semiconductor device according to claim 1, wherein the control current generation circuit is configured to feed the control current into the coupling node of the voltage dividing circuit, and
wherein the control current generation circuit decreases the control current generated as the output current detected by the current detection circuit increases.

7. The semiconductor device according to claim 6, wherein the current detection circuit generates a detection current proportional to the output current of the charge pump by using a current minor,
wherein the voltage dividing circuit comprises:
a first resistance element coupled between an output node of the charge pump and the coupling node; and
a second resistance element coupled between the coupling node and a ground node,
wherein the control current generation circuit comprises:
a first transistor coupled in parallel with the first resistance element;
a constant current source;
a second transistor coupled between an output node of the constant current source and the ground node; and
a third transistor coupled in parallel with the second transistor, and
wherein the control current generation circuit is configured to pass a current that is equal or proportional to the detection current of the current detection circuit through the second transistor by using a current mirror, and pass a current, as the control current, that is equal or proportional to a current flowing through the third transistor, through the first transistor.

8. The semiconductor device according to claim 7, wherein the control current generation circuit further comprises a fourth transistor coupled in parallel with the second and third transistors,
wherein the boosted voltage supply circuit further comprises a temperature-dependent current source which increases an output current as a temperature increases, and
wherein the temperature-dependent current source is configured to pass a current, as a part of the control current, that is equal or proportional to the output current of the temperature-dependent current source through the fourth transistor by using a current mirror.

9. The semiconductor device according to claim 6, wherein the control current generation circuit decreases the control current generated as a temperature increases.

10. The semiconductor device according to claim 1, wherein the voltage dividing circuit comprises:
a first resistance element coupled between an output node of the charge pump and the coupling node of the voltage dividing circuit; and
a second resistance element coupled between the coupling node of the voltage dividing circuit and a ground node, and
wherein the control current generation circuit comprises a first transistor coupled in parallel with the second resistance element.

11. The semiconductor device according to claim 10, wherein the control current generation circuit further comprises a second transistor coupled in parallel with the first transistor and the second resistance element.

12. The semiconductor device according to claim 11, wherein the boosted voltage supply circuit further comprises a temperature-dependent current source which increases an output current as temperature increases.

13. The semiconductor device according to claim 12, wherein the temperature-dependent current source is configured to pass a current, as a part of the control current, that is proportional to the output current of the temperature-dependent current source through the second transistor.

14. The semiconductor device according to claim 1, wherein the voltage dividing circuit comprises:
a first resistance element coupled between an output node of the charge pump and the coupling node; and
a second resistance element coupled between the coupling node and a ground node.

15. The semiconductor device according to claim 14, wherein the control current generation circuit further comprises:
a third transistor coupled in parallel with the second transistor.

16. The semiconductor device according to claim 15, wherein the control current generation circuit is configured to pass a current that is proportional to the detection current of the current detection circuit through the second transistor by using a current mirror.

17. The semiconductor device according to claim 15, wherein the control current generation circuit is configured to pass a current, as the control current, that is proportional to a current flowing through the third transistor, through the first transistor.

18. A semiconductor device, comprising:
a memory array in electrically rewritable memory cells are arranged in a matrix; and
a boosted voltage supply circuit for supplying a boosted voltage to the memory array to pass a write current through a plurality of memory cells subjected to writing during data writing,
the boosted voltage supply circuit comprising:
a charge pump for generating the boosted voltage;
an oscillation circuit for generating a clock signal for driving the charge pump; and
a voltage dividing circuit for outputting a divided voltage of the boosted voltage from a voltage dividing node,
the voltage diving circuit comprising:
a first resistance element coupled between an output node of the charge pump and the voltage dividing node; and
a second resistance element coupled between the voltage dividing node and a ground node,
the boosted voltage supply circuit further comprising:
a comparator for comparing the divided voltage with a reference voltage and performing on-off control of the oscillation circuit based on a comparison result;
a current detection circuit for generating a detection current proportional to the output current of the charge pump by using a current mirror; and a control current generation circuit for generating a control current, the control current generation circuit comprising a first transistor coupled in parallel with a first resistance element and a second resistance element;

a constant current source; and a second transistor coupled between an output node of the constant current source and a ground node, wherein the control current generation circuit is configured to pass a current, as the control current, that is equal or proportional to the detection current through the first transistor by using a current mirror.

19. A semiconductor device, comprising:

a memory array in which electrically rewritable memory cells are arranged in a matrix; and a boosted voltage supply circuit for supplying a boosted voltage to the memory array to pass a write current through a plurality of memory cells subjected to writing during data writing, the boosted voltage supply circuit comprising:

a charge pump for generating the boosted voltage;

an oscillation circuit for generating a clock signal for driving the charge pump; and a voltage dividing circuit for outputting a divided voltage of the boosted voltage from a voltage dividing node, the voltage dividing circuit comprising:

a first resistance element coupled between an output node of the charge pump and the voltage dividing node; and a second resistance element coupled between the voltage dividing node and a ground node, the boosted voltage supply circuit further comprising:

a comparator for comparing the divided voltage with a reference voltage and performing on-off control of the oscillation circuit based on a comparison result;

a current detection circuit for generating a detection current proportional to the output current of the charge pump by using a current minor; and a control current generation circuit for generating a control current, the control current generation circuit comprising:

a first transistor coupled in parallel with the first resistance element;

a constant current source;

a second transistor coupled between an output node of the constant current source and the ground node; and a third transistor coupled in parallel with the second transistor, wherein the control current generation circuit is configured to pass a current that is equal or proportional to the detection current of the current detection circuit through the second transistor by using a current mirror, and pass a current, as the control current, that is equal or proportional to a current flowing through the third transistor, through the first transistor.

* * * * *